(12) United States Patent
Ramesh

(10) Patent No.: US 11,727,964 B2
(45) Date of Patent: Aug. 15, 2023

(54) ARITHMETIC OPERATIONS IN MEMORY

(71) Applicant: Micron Technology, Inc., Boise, ID (US)

(72) Inventor: Vijay S. Ramesh, Boise, ID (US)

(73) Assignee: Micron Technology, Inc., Boise, ID (US)

(*) Notice: Subject to any disclaimer, the term of this patent is extended or adjusted under 35 U.S.C. 154(b) by 36 days.

(21) Appl. No.: 17/550,708

(22) Filed: Dec. 14, 2021

(65) Prior Publication Data

US 2022/0108731 A1 Apr. 7, 2022

Related U.S. Application Data

(63) Continuation of application No. 16/934,482, filed on Jul. 21, 2020, now Pat. No. 11,227,641.

(51) Int. Cl.
*G11C 7/10* (2006.01)
*G06F 9/30* (2018.01)
(Continued)

(52) U.S. Cl.
CPC .............. *G11C 7/1018* (2013.01); *G06F 7/50* (2013.01); *G06F 7/52* (2013.01); *G06F 7/523* (2013.01);
(Continued)

(58) Field of Classification Search
CPC ....... G11C 7/1018; G11C 7/06; G11C 7/1006; G11C 7/1051; G06F 7/50; G06F 7/52; G06F 9/3001; G06F 9/30025
See application file for complete search history.

(56) References Cited

U.S. PATENT DOCUMENTS 4,380,046 A 4/1983 Fung
4,435,792 A 3/1984 Bechtolsheim
(Continued)

FOREIGN PATENT DOCUMENTS

CN 102141905 8/2011
EP 0214718 3/1987
(Continued)

OTHER PUBLICATIONS

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.
(Continued)

*Primary Examiner* — Son L Mai
(74) *Attorney, Agent, or Firm* — Brooks, Cameron & Huebsch, PLLC

(57) ABSTRACT

Systems, apparatuses, and methods related to arithmetic operations in memory are described. The arithmetic operations may be performed using bit strings and within a memory array without transferring the bit strings to circuitry external to the memory array. For instance, sensing circuitry that can include a sense amplifier and a compute component can be coupled to a memory array. A controller can be coupled to the sensing circuitry and can be configured to cause one or more bit strings to be transferred from the memory array to the sensing circuitry. In addition to the arithmetic operations, the sensing circuitry can also perform a logical operation using the one or more bit strings.

20 Claims, 9 Drawing Sheets

(51) Int. Cl.
  *G06F 7/50* (2006.01)
  *G11C 7/06* (2006.01)
  *G06F 7/523* (2006.01)
  *G06F 7/52* (2006.01)

(52) U.S. Cl.
  CPC ........ *G06F 9/3001* (2013.01); *G06F 9/30025* (2013.01); *G11C 7/06* (2013.01); *G11C 7/1006* (2013.01); *G11C 7/1051* (2013.01)

(56) References Cited

U.S. PATENT DOCUMENTS

| | | |
|---|---|---|
| 4,435,793 A | 3/1984 | Ochii |
| 4,727,474 A | 2/1988 | Batcher |
| 4,758,972 A | 7/1988 | Frazier |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth et al. |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,865,541 B1 | 1/2011 | Langhammer |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mokhlesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,214,417 B2 | 7/2012 | Ahmed |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |

(56) References Cited

U.S. PATENT DOCUMENTS

| | | |
|---|---|---|
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,659,605 B1 | 5/2017 | Zawodny et al. |
| 9,659,610 B1 | 5/2017 | Hush |
| 9,697,876 B1 | 7/2017 | Tiwari et al. |
| 9,761,300 B1 | 9/2017 | Willcock |
| 9,997,212 B1 | 6/2018 | Finkbeiner et al. |
| 10,068,664 B1 | 9/2018 | Penney et al. |
| 10,903,849 B1 * | 1/2021 | Ramesh ............... H03M 7/4093 |
| 10,942,890 B2 | 3/2021 | Ramesh |
| 11,188,329 B1 * | 11/2021 | Ramesh ................ G06F 9/3001 |
| 11,360,768 B2 * | 6/2022 | Ramesh .............. G06F 9/30025 |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0279466 A1 | 10/2015 | Manning |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0098208 A1 | 4/2016 | Willcock |
| 2016/0098209 A1 | 4/2016 | Leidel et al. |

(56) References Cited

U.S. PATENT DOCUMENTS

| | | |
|---|---|---|
| 2016/0110135 A1 | 4/2016 | Wheeler et al. |
| 2016/0125919 A1 | 5/2016 | Hush |
| 2016/0154596 A1 | 6/2016 | Willcock et al. |
| 2016/0155482 A1 | 6/2016 | La Fratta |
| 2016/0188250 A1 | 6/2016 | Wheeler |
| 2016/0196142 A1 | 7/2016 | Wheeler et al. |
| 2016/0196856 A1 | 7/2016 | Tiwari et al. |
| 2016/0225422 A1 | 8/2016 | Tiwari et al. |
| 2016/0266873 A1 | 9/2016 | Tiwari et al. |
| 2016/0266899 A1 | 9/2016 | Tiwari |
| 2016/0267951 A1 | 9/2016 | Tiwari |
| 2016/0292080 A1 | 10/2016 | Leidel et al. |
| 2016/0306584 A1 | 10/2016 | Zawodny et al. |
| 2016/0306614 A1 | 10/2016 | Leidel et al. |
| 2016/0350230 A1 | 12/2016 | Murphy |
| 2016/0365129 A1 | 12/2016 | Willcock |
| 2016/0371033 A1 | 12/2016 | La Fratta et al. |
| 2017/0052906 A1 | 2/2017 | Lea |
| 2017/0178701 A1 | 6/2017 | Willcock et al. |
| 2017/0192844 A1 | 7/2017 | Lea et al. |
| 2017/0228192 A1 | 8/2017 | Willcock et al. |
| 2017/0235515 A1 | 8/2017 | Lea et al. |
| 2017/0236564 A1 | 8/2017 | Zawodny et al. |
| 2017/0242902 A1 | 8/2017 | Crawford et al. |
| 2017/0243623 A1 | 8/2017 | Kirsch et al. |
| 2017/0262369 A1 | 9/2017 | Murphy |
| 2017/0263306 A1 | 9/2017 | Murphy |
| 2017/0269865 A1 | 9/2017 | Willcock et al. |
| 2017/0269903 A1 | 9/2017 | Tiwari |
| 2017/0277433 A1 | 9/2017 | Willcock |
| 2017/0277440 A1 | 9/2017 | Willcock |
| 2017/0277581 A1 | 9/2017 | Lea et al. |
| 2017/0277637 A1 | 9/2017 | Willcock et al. |
| 2017/0278559 A1 | 9/2017 | Hush |
| 2017/0278584 A1 | 9/2017 | Rosti |
| 2017/0285988 A1 | 10/2017 | Dobelstein |
| 2017/0293434 A1 | 10/2017 | Tiwari |
| 2017/0301379 A1 | 10/2017 | Hush |
| 2017/0309314 A1 | 10/2017 | Zawodny et al. |
| 2017/0329577 A1 | 11/2017 | Tiwari |
| 2017/0336989 A1 | 11/2017 | Zawodny et al. |
| 2017/0337126 A1 | 11/2017 | Zawodny et al. |
| 2017/0337953 A1 | 11/2017 | Zawodny et al. |
| 2017/0352391 A1 | 12/2017 | Hush |
| 2017/0371539 A1 | 12/2017 | Mai et al. |
| 2018/0012636 A1 | 1/2018 | Alzheimer et al. |
| 2018/0024769 A1 | 1/2018 | Howe et al. |
| 2018/0024926 A1 | 1/2018 | Penney et al. |
| 2018/0025759 A1 | 1/2018 | Penney et al. |
| 2018/0025768 A1 | 1/2018 | Hush |
| 2018/0032458 A1 | 2/2018 | Bell |
| 2018/0033478 A1 | 2/2018 | Lea et al. |
| 2018/0039484 A1 | 2/2018 | La Fratta et al. |
| 2018/0046405 A1 | 2/2018 | Hush et al. |
| 2018/0046461 A1 | 2/2018 | Tiwari |
| 2018/0060069 A1 | 3/2018 | Rosti et al. |
| 2018/0074754 A1 | 3/2018 | Crawford |
| 2018/0075899 A1 | 3/2018 | Hush |
| 2018/0088850 A1 | 3/2018 | Willcock |
| 2018/0102147 A1 | 4/2018 | Willcock et al. |
| 2018/0108397 A1 | 4/2018 | Venkata et al. |
| 2018/0130515 A1 | 5/2018 | Zawodny et al. |
| 2018/0136871 A1 | 5/2018 | Leidel |
| 2018/0239531 A1 | 8/2018 | Lea |
| 2018/0239712 A1 | 8/2018 | Lea |
| 2018/0240510 A1 | 8/2018 | Hush et al. |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1999 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.

Boyd et al., "On the General Applicability of Instruction-Set Randomization", Jul.-Sep. 2010, (14 pgs.), vol. 7, Issue 3, IEEE Transactions on Dependable and Secure Computing.

Elliot, et al., "Computational RAM: Implementing Processors in Memory", Jan.-Mar. 1999, (10 pgs.), vol. 16, Issue 1, IEEE Design and Test of Computers Magazine.

Gustafson, et al. "Beating Floating Point at its Own Game: Posit Arithmetic", Jan. 2017, (16 pgs), retrieved from <http://www.johngustafson.net/pdfs/BeatingFloatingPoint.pdf>.

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing In Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

International Search Report and Written Opinion for PCT Application No. PCT/US2013/043702, dated Sep. 26, 2013, (11 pgs.).

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

Pagiamtzis, Kostas, "Content-Addressable Memory Introduction", Jun. 25, 2007, (6 pgs.), retrieved from: http://www.pagiamtzis.com/cam/camintro.

Debnath, Biplob, Bloomflash: Bloom Filter on Flash-Based Storage, 2011 31st Annual Conference on Distributed Computing Systems, Jun. 20-24, 2011, 10 pgs.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

* cited by examiner

880 ─►

```
┌─────────────────────────────────────────────────────────────┐
│   CONVERTING, TO PERFORM A MULTIPLICATION OPERATION         │
│   USING OPERANDS OF NUMERICAL VALUES INDICATED              │
│   BY RESPECTIVE BIT STRINGS, EACH OF THE RESPECTIVE BIT     │─── 884
│   STRINGS TO A NUMBER OF BIT STRINGS EACH CORRESPONDING     │
│   TO A NUMERATOR OR A DENOMINATOR OF A RESPECTIVE ONE OF    │
│   THE NUMERICAL VALUES                                      │
└─────────────────────────────────────────────────────────────┘
                              │
┌─────────────────────────────────────────────────────────────┐
│   WRITING A FIRST BIT STRING OF THE NUMBER OF BIT STRINGS   │
│   CORRESPONDING TO ONE OF THE NUMERATORS OF THE OPERANDS    │─── 886
│   TO A FIRST ROW AND A SECOND ROW OF A MEMORY ARRAY         │
└─────────────────────────────────────────────────────────────┘
                              │
┌─────────────────────────────────────────────────────────────┐
│   UPDATING A VALUE OF A COUNTER IN RESPONSE                 │─── 888
│   TO WRITING THE FIRST BIT STRING                           │
└─────────────────────────────────────────────────────────────┘
                              │
┌─────────────────────────────────────────────────────────────┐
│  PERFORMING, UNTIL THE VALUE OF THE COUNTER REACHES         │─── 890
│  A PARTICULAR VALUE, A NUMBER OF FIRST ADDITION OPERATIONS  │
│  ┌───────────────────────────────────────────────────────┐  │
│  │   USING THE FIRST BIT STRING STORED IN                │──┼── 892
│  │   THE FIRST ROW AS A FIRST OPERAND                    │  │
│  └───────────────────────────────────────────────────────┘  │
│  ┌───────────────────────────────────────────────────────┐  │
│  │   USING, AS A SECOND OPERAND, A BIT STRING STORED     │  │
│  │   IN THE SECOND ROW OR A BIT STRING STORED IN         │  │
│  │   A THIRD ROW OF THE MEMORY ARRAY, WHICHEVER HAS      │──┼── 894
│  │   A GREATER CORRESPONDING NUMERICAL VALUE             │  │
│  └───────────────────────────────────────────────────────┘  │
│  ┌───────────────────────────────────────────────────────┐  │
│  │   WRITING, SUBSEQUENT TO EACH OF THE NUMBER           │  │
│  │   OF FIRST ADDITION OPERATIONS, A RESULT OF           │  │
│  │   A RESPECTIVE ONE OF THE NUMBER OF FIRST ADDITION    │──┼── 896
│  │   OPERATIONS ALTERNATIVELY IN THE SECOND ROW          │  │
│  │   OR THE THIRD ROW OF THE MEMORY ARRAY                │  │
│  └───────────────────────────────────────────────────────┘  │
└─────────────────────────────────────────────────────────────┘
```

ARITHMETIC OPERATIONS IN MEMORY

PRIORITY INFORMATION

This application is a Continuation of U.S. application Ser. No. 16/934,482, filed Jul. 21, 2020, the contents of which are included herein by reference.

TECHNICAL FIELD

The present disclosure relates generally to semiconductor memory and methods, and more particularly, to apparatuses, systems, and methods for arithmetic operations in memory.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Memory devices may be coupled to a host (e.g., a host computing device) to store data, commands, and/or instructions for use by the host while the computer or electronic system is operating. For example, data, commands, and/or instructions can be transferred between the host and the memory device(s) during operation of a computing or other electronic system.

BRIEF DESCRIPTION OF THE DRAWINGS

FIG. 8 is a flow diagram representing an example method for arithmetic operations in memory in accordance with a number of embodiments of the present disclosure.

DETAILED DESCRIPTION

Figure 1A:
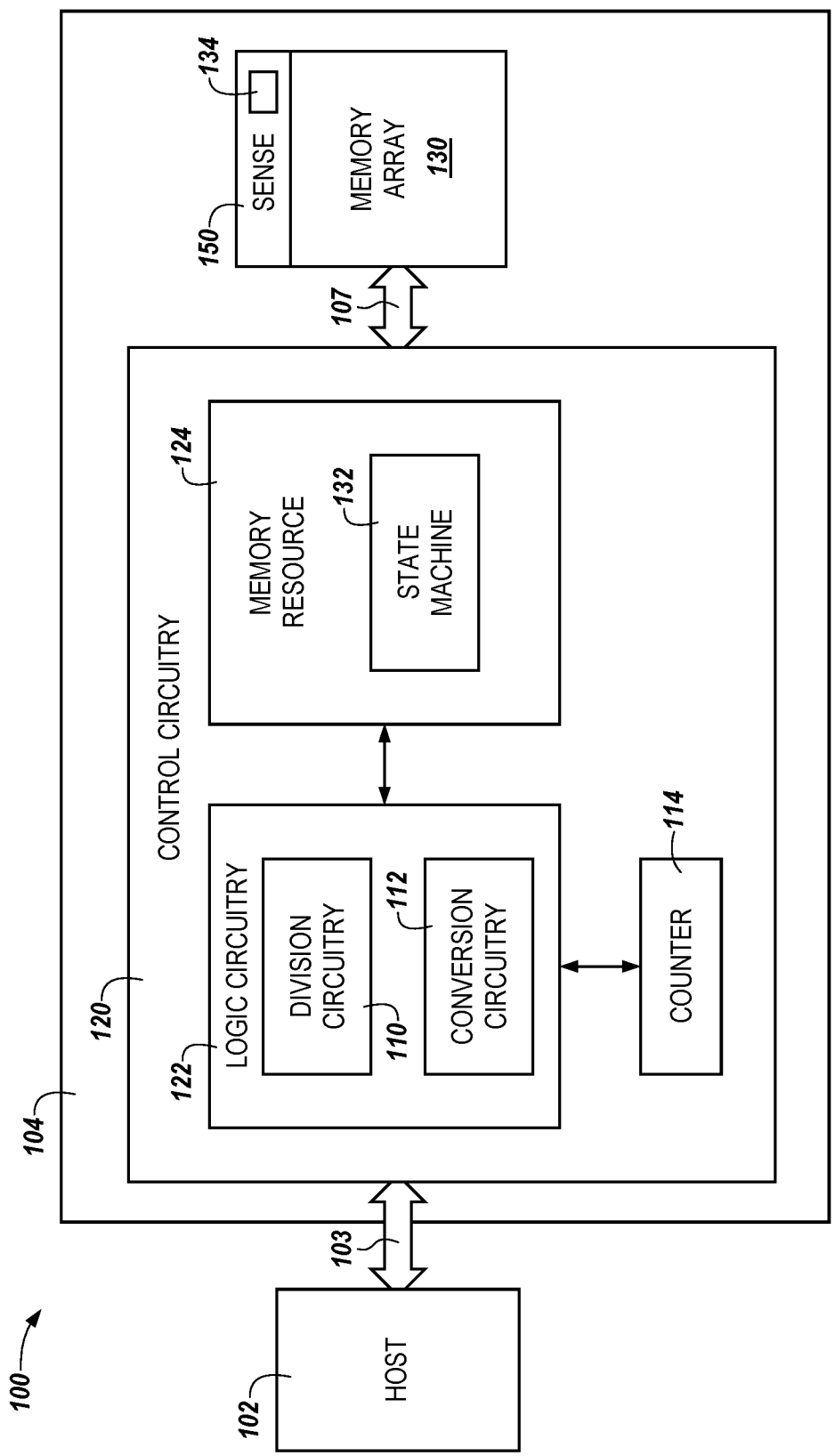
FIG. 1A is a functional block diagram in the form of an apparatus including a host and a memory device in accordance with a number of embodiments of the present disclosure.

Systems, apparatuses, and methods related to arithmetic operations in memory are described. The arithmetic operations may be performed using bit strings and within a memory array without transferring the bit strings to circuitry external to the memory array. For instance, sensing circuitry that can include a sense amplifier and a compute component can be coupled to a memory array. A controller can be coupled to the sensing circuitry and can be configured to cause one or more bit strings to be transferred from the memory array to the sensing circuitry. In addition to the arithmetic operations, the sensing circuitry can also perform a logical operation using the one or more bit strings.

In previous approaches, data (e.g., operands of arithmetic operations) may be transferred from the array and sensing circuitry (e.g., via a bus comprising input/output (I/O) lines) to a number of registers that can be used by a processing resource such as a processor, microprocessor, and/or compute engine, which may include ALU circuitry and/or other functional unit circuitry configured to perform the appropriate operations (e.g., arithmetic operations and/or logic operations). Transferring data to/from memory from/to registers via a bus can involve increased complexity and/or size of the circuitry, significant power consumption, and/or significant time requirements to perform the operations. Therefore, performance of operations that involves data transfer off the chip (e.g., array) and/or that requires significant time requirement may not desirable for processing and/or time intensive operations (e.g., neural network operations).

In contrast, a number of embodiments of the present disclosure can provide a reduction of the number of computations and a time involved in performing a number of arithmetic operations (e.g., multiplication operations) over previous approaches. The computations and the time can be reduced because data being used for the operations need not be transferred off the chip (e.g., without transferring data via a bus, such as data bus, address bus, control bus, etc.) and/or the number of arithmetic operations can be performed in parallel (e.g., simultaneously).

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "N" "M," "X," and "Y," etc., particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a," "an," and "the" can include both singular and plural referents, unless the context clearly dictates otherwise. In addition, "a number of," "at least one," and "one or more" (e.g., a number of memory banks) can refer to one or more memory banks, whereas a "plurality of" is intended to refer to more than one of such things.

Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled" and "coupling" mean to be directly or indirectly connected physically or for access to and movement (transmission) of commands and/or data, as appropriate to the context. The terms "bit strings," "data," and "data values" are used interchangeably herein and can have the same meaning, as appropriate to the context. In addition, the terms "set of bits," "bit sub-set," and "portion" (in the context of a portion of bits of a bit string) are used interchangeably herein and can have the same meaning, as appropriate to the context.

The figures herein follow a numbering convention in which the first digit or digits correspond to the figure number and the remaining digits identify an element or component in the figure. Similar elements or components between different figures may be identified by the use of similar digits. For example, 120 may reference element "20" in FIG. 1, and a similar element may be referenced as 220 in FIG. 2. A group or plurality of similar elements or components may generally be referred to herein with a single element number. For example, a plurality of reference elements 431-1, 431-2, . . . , 431-3 may be referred to generally as 431. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1A is a functional block diagram in the form of a computing system 100 including an apparatus including a host 102 and a memory device 104 in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. The memory device 104 can include a one or more memory modules (e.g., single in-line memory modules, dual in-line memory modules, etc.). The memory device 104 can include volatile memory and/or non-volatile memory. In a number of embodiments, memory device 104 can include a multi-chip device. A multi-chip device can include a number of different memory types and/or memory modules. For example, a memory system can include non-volatile or volatile memory on any type of a module. As shown in FIG. 1, the apparatus 100 can include control circuitry 120, which can include logic circuitry 122 and a memory resource 124, a memory array 130, and sensing circuitry 150 (e.g., the SENSE 150). In addition, each of the components (e.g., the host 102, the control circuitry 120, the logic circuitry 122, the memory resource 124, the memory array 130, and/or the sensing circuitry 150) can be separately referred to herein as an "apparatus." The control circuitry 120 may be referred to as a "processing device" or "processing unit" herein.

The memory device 104 can provide main memory for the computing system 100 or could be used as additional memory or storage throughout the computing system 100. The memory device 104 can include one or more memory arrays 130 (e.g., arrays of memory cells), which can include volatile and/or non-volatile memory cells. The memory array 130 can be a flash array with a NAND architecture, for example. Embodiments are not limited to a particular type of memory device. For instance, the memory device 104 can include RAM, ROM, DRAM, SDRAM, PCRAM, RRAM, and flash memory, among others.

In embodiments in which the memory device 104 includes non-volatile memory, the memory device 104 can include flash memory devices such as NAND or NOR flash memory devices. Embodiments are not so limited, however, and the memory device 104 can include other non-volatile memory devices such as non-volatile random-access memory devices (e.g., NVRAM, ReRAM, FeRAM, MRAM, PCM), "emerging" memory devices such as resistance variable (e.g., 3-D Crosspoint (3D XP)) memory devices, memory devices that include an array of self-selecting memory (SSM) cells, etc., or combinations thereof. Resistance variable memory devices can perform bit storage based on a change of bulk resistance, in conjunction with a stackable cross-gridded data access array. Additionally, in contrast to many flash-based memories, resistance variable non-volatile memory can perform a write in-place operation, where a non-volatile memory cell can be programmed without the non-volatile memory cell being previously erased. In contrast to flash-based memories and resistance variable memories, self-selecting memory cells can include memory cells that have a single chalcogenide material that serves as both the switch and storage element for the memory cell.

As illustrated in FIG. 1, a host 102 can be coupled to the memory device 104. In a number of embodiments, the memory device 104 can be coupled to the host 102 via one or more channels (e.g., channel 103). In FIG. 1, the memory device 104 is coupled to the host 102 via channel 103 and acceleration circuitry 120 of the memory device 104 is coupled to the memory array 130 via a channel 107. The host 102 can be a host system such as a personal laptop computer, a desktop computer, a digital camera, a smart phone, a memory card reader, and/or an internet-of-things (IoT) enabled device, among various other types of hosts.

The host 102 can include a system motherboard and/or backplane and can include a memory access device, e.g., a processor (or processing device). One of ordinary skill in the art will appreciate that "a processor" can intend one or more processors, such as a parallel processing system, a number of coprocessors, etc. The system 100 can include separate integrated circuits or both the host 102, the memory device 104, and the memory array 130 can be on the same integrated circuit. The system 100 can be, for instance, a server system and/or a high-performance computing (HPC) system and/or a portion thereof. Although the example shown in FIG. 1 illustrate a system having a Von Neumann architecture, embodiments of the present disclosure can be implemented in non-Von Neumann architectures, which may not include one or more components (e.g., CPU, ALU, etc.) often associated with a Von Neumann architecture.

The memory device 104, which is shown in more detail in FIG. 2, herein, can include control circuitry 120, which can include logic circuitry 122 and a memory resource 124. The logic circuitry 122 can be provided in the form of an integrated circuit, such as an application-specific integrated circuit (ASIC), field programmable gate array (FPGA), reduced instruction set computing device (RISC), advanced RISC machine, system-on-a-chip, or other combination of hardware and/or circuitry that is configured to perform operations described in more detail, herein. In some embodiments, the logic circuitry 122 can include one or more processors (e.g., processing device(s), processing unit(s), etc.).

The control circuitry 120 can include a memory resource 124, which can be communicatively coupled to the logic circuitry 122. The memory resource 124 can include volatile memory resource, non-volatile memory resources, or a combination of volatile and non-volatile memory resources. In some embodiments, the memory resource can be a random-access memory (RAM) such as static random-access memory (SRAM). Embodiments are not so limited, however, and the memory resource can be a cache, one or more registers, NVRAM, ReRAM, FeRAM, MRAM, PCM), "emerging" memory devices such as resistance variable memory resources, phase change memory devices, memory devices that include arrays of self-selecting memory cells, etc., or combinations thereof.

The memory resource 124 can include a state machine 132 that is configured to control data (e.g., bit strings) movement among various components, such as logic circuitry 122 and/or sensing circuitry 150. For example, the state machine 132 can be configured to write (e.g., move) bit strings stored in (e.g., registers of) the sensing circuitry 150 to the memory resource 124 (e.g., and to the logic circuitry 122 ) such that the logic circuitry 122 can further perform operations using the bit strings written to the memory resource 124. The state machine 132 can further be configured to write (e.g., copy) resultant bit strings (e.g., a result of the operations) received from the logic circuitry 122 to the sensing circuitry 150 (e.g., and to the memory array 130). As described herein, the operations that can be performed (e.g., by the logic circuitry 122) using the bit strings stored in the memory resource 124 can include a conversion operation that converts a format of the bit strings to a different format.

Bit strings can be stored within the memory resource 124, memory array 130, and/or logic circuitry 122 according to various format, such as "floating-point" format (e.g., the IEEE 754 floating-point format) and/or "universal number" (unum) format. Under the floating-point standard, bit strings (e.g., strings of bits that can represent a number), such as binary number strings, are represented in terms of three sets of integers or sets of bits—a set of bits referred to as a "base," a set of bits referred to as an "exponent," and a set of bits referred to as a "mantissa" (or significand). The sets of integers or bits that define the format in which a binary number string is stored may be referred to herein as an "numeric format," or "format," for simplicity. For example, the three sets of integers of bits described above (e.g., the base, exponent, and mantissa) that define a floating-point bit string may be referred to as a format (e.g., a first format). As described in more detail below, a posit bit string may include four sets of integers or sets of bits (e.g., a sign, a regime, an exponent, and a mantissa), which may also be referred to as a "numeric format," or "format," (e.g., a second format). In addition, under the floating-point standard, two infinities (e.g., +∞ and −∞) and/or two kinds of "NaN" (not-a-number): a quiet NaN and a signaling NaN, may be included in a bit string.

An alternative format to floating-point is referred to as a "universal number" (unum) format. There are several forms of unum formats—Type I unums, Type II unums, and Type III unums, which can be referred to as "posits" and/or "valids." Type I unums are a superset of the IEEE 754 standard floating-point format that use a "ubit" at the end of the mantissa to indicate whether a real number is an exact float, or if it lies in the interval between adjacent floats. The sign, exponent, and mantissa bits in a Type I unum take their definition from the IEEE 754 floating-point format, however, the length of the exponent and mantissa fields of Type I unums can vary dramatically, from a single bit to a maximum user-definable length. By taking the sign, exponent, and mantissa bits from the IEEE 754 standard floating-point format, Type I unums can behave similar to floating-point numbers, however, the variable bit length exhibited in the exponent and fraction bits of the Type I unum can require additional management in comparison to floats.

Type II unums are generally incompatible with floats, however, Type II unums can permit a clean, mathematical design based on projected real numbers. A Type II unum can include n bits and can be described in terms of a "u-lattice" in which quadrants of a circular projection are populated with an ordered set of $2^{n-3}-1$ real numbers. The values of the Type II unum can be reflected about an axis bisecting the circular projection such that positive values lie in an upper right quadrant of the circular projection, while their negative counterparts lie in an upper left quadrant of the circular projection. The lower half of the circular projection representing a Type II unum can include reciprocals of the values that lie in the upper half of the circular projection. Type II unums generally rely on a look-up table for most operations. As a result, the size of the look-up table can limit the efficacy of Type II unums in some circumstances. However, Type II unums can provide improved computational functionality in comparison with floats under some conditions.

The Type III unum format is referred to herein as a "posit format" or, for simplicity, a "posit." As used herein, the bit string stored of the unum (e.g., a Type III unum) or posit format can include several sub-sets of bits or "bit sub-sets." For example, a universal number or posit bit string can include a bit sub-set referred to as a "sign" or "sign portion," a bit sub-set referred to as a "regime" or "regime portion," a bit sub-set referred to as an "exponent" or "exponent portion," and a bit sub-set referred to as a "mantissa" or "mantissa portion" (or significand). As used herein, a bit sub-set is intended to refer to a sub-set of bits included in a bit string. Examples of the sign, regime, exponent, and mantissa sets of bits are described in more detail in connection with FIGS. 3 and 4A-4B, herein.

Operations (e.g., arithmetic operations) described herein can be performed using bit strings of various formats. For example, the operations can be performed with a first format (e.g., a floating-point format or a fixed-point binary format) if the first format is desired, while the operations can also be performed with a second format (e.g., a posit format or a unum format) if the second format is more desired than the first format. To selectively perform the operations with a desired format, the computing system 100 can include circuitry configured to convert a format of bit strings, such as conversion circuitry 112 located within the logic circuitry 122.

For example, the logic circuitry 122 can cause bit strings stored in the memory resource 124 to be transferred to the logic circuitry 122 and perform a conversion operation on the transferred bit strings to convert the bit strings between various formats, such as the first format and the second format. For example, the logic circuitry 122 can convert, using the conversion circuitry 122, bit strings that are in a posit or a universal number format to bit strings in an floating-point format (e.g., the IEEE 754 floating-point format) or a fixed-point binary format, although embodiments are not so limited.

As used herein, the bit string stored of the unum (e.g., a Type III unum) or posit format can include several sub-sets of bits or "bit sub-sets." For example, a universal number or posit bit string can include a bit sub-set referred to as a "sign" or "sign portion," a bit sub-set referred to as a "regime" or "regime portion," a bit sub-set referred to as an "exponent" or "exponent portion," and a bit sub-set referred to as a "mantissa" or "mantissa portion" (or significand). As used herein, a bit sub-set is intended to refer to a sub-set of bits included in a bit string. Examples of the sign, regime, exponent, and mantissa sets of bits are described in more detail in connection with FIGS. 3 and 4A-4B, herein.

The logic circuitry 122 can further be configured to perform various other operations on the transferred bit strings. For example, the operations can include arithmetic operations such as addition, subtraction, multiplication, division, fused multiply addition, multiply-accumulate, dot product units, greater than or less than, absolute value (e.g., FABS( )), fast Fourier transforms, inverse fast Fourier transforms, sigmoid function, convolution, square root, exponent, and/or logarithm operations, and/or recursive logical operations such as AND, OR, XOR, NOT, etc., as well as trigonometric operations such as sine, cosine, tangent, etc. using the posit bit strings. As will be appreciated, the foregoing list of operations is not intended to be exhaustive, nor is the foregoing list of operations intended to be limiting, and the logic circuitry 122 may be configured to perform (or cause performance of) other arithmetic and/or logical operations. For example, the logic circuitry 122 includes division circuitry 110 that is configured to perform a division operation using bit string stored in the memory resource 124. The division operation can be performed along with various other operations. For example, for performing a multiplication operation of those operands that are in forms of fractions (e.g., including numerators and denominators), a first multiplication operation can be performed using the numerators and a second multiplication operation can be performed using the denominators. Once results of the first and second multiplication operations are obtained, the results can be divided (e.g., the result of the first is divided by the result of the second) using the logic circuitry 110, which can provide a result of the multiplication of the fraction operands.

Subsequent to performing the operations (e.g., conversion operation and/or division operation) on the bit strings, the logic circuitry 122 can transfer the resultant bit strings to the memory resource 124. For example, the bit strings that were stored in a first format (e.g., a unum or posit format) within the memory array 130 can be converted to a second format (e.g., floating-point format or fixed-point binary format) at the logic circuitry 122 (e.g., using division circuitry 110) and the converted bit strings can be transferred to and stored in the memory resource 124 according to the second format. The memory resource 124 can further transfer, using the state machine 132, the converted bit strings to the sensing circuitry 150 such that the sensing circuitry 150 can be configured to cause performance of an arithmetic operation or a logical operation, or both, using the bit strings having the second format (e.g., floating-point format or fixed-point binary format). However, embodiments are not so limited. A format of bit strings can be converted at, for example, the host 102. In this example, the logic circuitry 122 can transfer the bit strings received from the memory resource 124 and/or the memory array 130 to the host 102 where the bit strings can be converted and receive the converted bit strings back from the host 102 (e.g., such that the converted bit strings can be further transferred to the memory resource 124 and/or memory array 130).

The memory device 104 can further include a counter 114 communicatively coupled to the logic circuitry 122. The logic circuitry 122 can perform, along with various operations, a counter update operation on the counter 114 that includes initializing, decrementing, and/or incrementing a value of the counter 114 (e.g., counter value). For example, the logic circuitry 122 can initialize a value of the counter (e.g., counter value) and keep a track of a number of times an arithmetic operation has been performed by decrementing/incrementing the counter value (e.g., by comparing the updated counter value to the initial counter value). Although the counter 114 is illustrated to be located within the control circuitry 120, embodiment are not so limited. For example, the counter 114 may also be located within the memory array 130, sensing circuitry 150, and/or host 102.

Figure 1B:
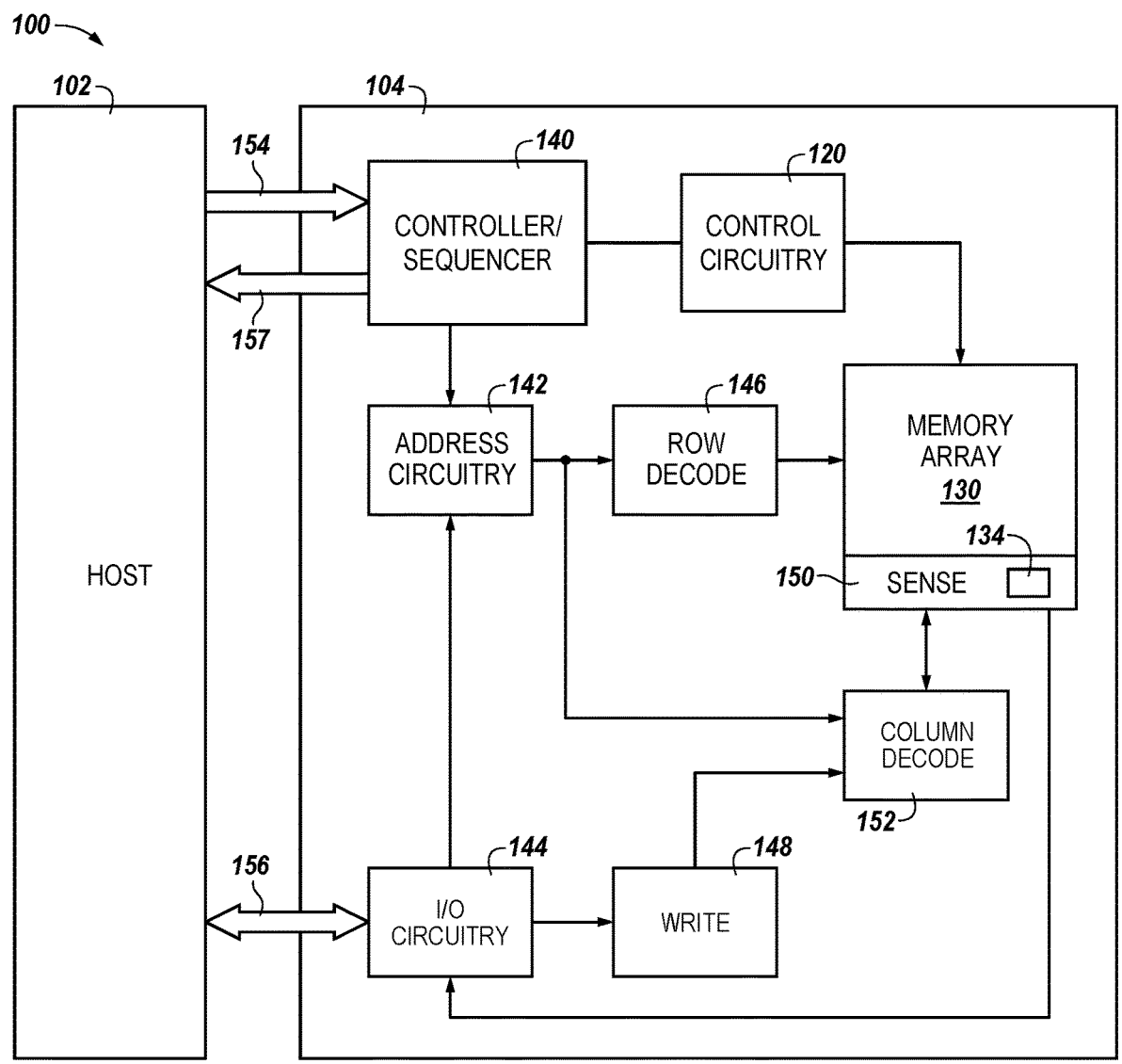
FIG. 1B is a block diagram of an apparatus in the form of an electronic system including a memory device in accordance with a number of embodiments of the present disclosure.

As shown in FIG. 1, sensing circuitry 150 is coupled to a memory array 130 and the control circuitry 120. The sensing circuitry 150 can include one or more sense amplifiers and one or more compute components, which are described in more detail in connection with FIG. 6, herein. The sensing circuitry 150 can provide additional storage space for the memory array 130 and can sense (e.g., read, store, cache) data values that are present in the memory device 104. In some embodiments, the sensing circuitry 150 can be located in a periphery area of the memory device 104. For example, the sensing circuitry 150 can be located in an area of the memory device 104 that is physically distinct from the memory array 130. The sensing circuitry 150 can include sense amplifiers, latches, flip-flops, etc. that can be configured to stored data values, as described herein. In some embodiments, the sensing circuitry 150 can be provided in the form of a register or series of registers (e.g., register 134) and can include a same quantity of storage locations (e.g., sense amplifiers, latches, etc.) as there are rows or columns of the memory array 130. For example, if the memory array 130 contains around 16K rows or columns, the sensing circuitry 150 can include around 16K storage locations. Accordingly, in some embodiments, the sensing circuitry 150 can be a register that is configured to hold up to 16K data values, although embodiments are not so limited as described in more detail in connection with FIGS. 1B, 2A, and 6, herein. In some embodiments, bit strings received from the memory resource 124 and/or intermediate results obtained during performance of operations on bit strings stored within the memory array 130 can be initially stored in the registers 134.

The embodiment of FIG. 1 can include additional circuitry that is not illustrated so as not to obscure embodiments of the present disclosure. For example, the memory device 104 can include address circuitry to latch address signals provided over I/O connections through I/O circuitry. Address signals can be received and decoded by a row decoder and a column decoder to access the memory device 104 and/or the memory array 130. It will be appreciated by those skilled in the art that the number of address input connections can depend on the density and architecture of the memory device 104 and/or the memory array 130.

FIG. 1B is a block diagram of an apparatus in the form of an electronic system 100 including a memory device 120 in accordance with a number of embodiments of the present disclosure. As used herein, a memory device 120, memory controller 140, channel controller 143, memory array 130, sensing circuitry 150 might each also be separately considered an "apparatus."

In this example, the system 100 includes a host 102 coupled (e.g., connected) to memory device 120, which includes the memory array 130. The host 102 can be a host system such as a personal laptop computer, a desktop computer, a tablet computer, a digital camera, a smart phone, an internet-of-things (IoT) enabled device, or a memory card reader, among various other types of hosts. The host 102 can include a system motherboard and/or backplane and can include a number of processing resources (e.g., one or more processors, microprocessors, or some other type of controlling circuitry). The system 100 can include separate integrated circuits or both the host 102 and the memory device 120 can be on the same integrated circuit. The system 100 can be, for instance, a server system and a high-performance computing (HPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, description of the system 100 has been simplified to focus on features with particular relevance to the present disclosure. For example, in various embodiments, the memory array 130 can be a DRAM array, SRAM array, STT RAM array, PCRAM array, TRAM array, RRAM array, NAND flash array, and NOR flash array, for instance. The memory array 130 can include memory cells arranged in rows coupled by access lines (which may be referred to herein as word lines or select lines) and columns coupled by sense lines (which may be referred to herein as data lines or digit lines). Although a single memory array 130 is shown in FIG. 1, embodiments are not so limited. For instance, memory device 120 may include a number of memory arrays 130 (e.g., a number of banks of DRAM cells, NAND flash cells, etc.).

The memory device 120 includes address circuitry 142 to latch address signals provided over an address/control bus 154 (e.g., an address/control bus from the host 102). Address signals are received by address circuitry 142 and decoded by row decode circuitry 146 and column decode circuitry 152 to access the memory array 130. Although the address/control bus 154 is shown as a single bus, the bus 154 can comprise separate address and control busses. The column decode circuitry 152 can comprise logic (e.g., multiplexor circuitry) to selectively couple shared I/O lines to subsets of sensing components in association with reversing data stored in memory in accordance with embodiments described herein. The shared I/O (SIO) lines can provide an increased data path size (e.g., width) as compared to previous data paths used to move data from the array 130 to DQ pads, for instance, among other benefits. For instance, in a number of embodiments, the SIO lines may serve as both local I/O lines and global I/O lines corresponding to array 130, which can facilitate moving data between subarrays (e.g., portions of a memory array being coupled to separate sensing circuitry stripes).

Data can be sensed (read) from memory array 130 by sensing voltage and/or current changes on digit lines using a number of sensing components (e.g., sense amplifiers) of the sensing circuitry 150. A sense amplifier can read and latch a page (e.g., a row) of data from the memory array 130. As described further herein, the sensing components of the sensing circuitry 150 can comprise respective sense amplifiers and corresponding compute components coupled thereto that can be used to sense, store (e.g., cache and/or buffer), and move data, for instance. The I/O circuitry 144 can be used for bi-directional data communication with host 102 over the data bus 156 (e.g., DQ connections). The write circuitry 148 can be used to write data to the memory array 130.

The memory controller 140, which can serve as a sequencer, can decode control signals (e.g., commands) provided by address/control bus 154 from the host 102. These signals can include chip enable signals, write enable signals, and address latch signals that can be used to control operations performed on the memory array 130, including data sense, data store, data move, data write, and data erase operations, among other operations. The memory controller 140 can be responsible for executing instructions from the host 102 and/or accessing the memory array 130. The memory controller 140 can be a state machine, a sequencer, or some other type of controller and can be implemented in hardware, software, firmware, and/or combinations thereof. In the example shown in FIG. 1, system 100 includes a bus 157 which can provide, for example, status and exception information from the memory controller 140 to a channel controller 143.

Examples of the sensing circuitry 150 are described further below (e.g., in FIG. 6). For instance, in a number of embodiments, the sensing circuitry 150 can include a number of sense amplifiers and corresponding compute components, which may serve as an accumulator and can be used to perform arithmetic and/or logical operations on universal number or posit bit strings received from the control circuitry 120. The sensing circuitry 150 can be used to reverse data stored in memory (e.g., in array 130) in accordance with embodiments described herein.

In a number of embodiments, the sensing circuitry 150 can also be used to perform logical operations (e.g., logical functions such as AND, OR, NOT, NOR, NAND, XOR, etc.) using data stored in memory array 130 as inputs and participate in movement of the data for writing and storage operations back to a different location in the memory array 130 without transferring the data via a sense line address access (e.g., without firing a column decode signal). As such, various compute functions can be performed using, and within, sensing circuitry 150 rather than (or in association with) being performed by processing resources external to the sensing circuitry 150 (e.g., by a processor associated with host 102 and other processing circuitry, such as ALU circuitry, located on device 120, such as on memory controller 140 or elsewhere).

In various previous approaches, data associated with an operand, for instance, would be read from memory via sensing circuitry and provided to external ALU circuitry via I/O lines (e.g., via local I/O lines and global I/O lines). The external ALU circuitry could include a number of registers and would perform compute functions using the operands, and the result would be transferred back to the array via the I/O lines. In contrast, in a number of embodiments of the present disclosure, sensing circuitry 150 is configured to perform logical operations on data stored in memory array 130 and store the result back to the memory array 130 without enabling a local I/O line and global I/O line coupled to the sensing circuitry 150. The sensing circuitry 150 can be formed on pitch with the memory cells of the array.

As such, in a number of embodiments, circuitry external to memory array 130 and sensing circuitry 150 is not needed to reverse data stored in memory array 130 and/or to perform compute functions as the sensing circuitry 150 can perform the appropriate operations in order to perform such data reversal and/or compute functions without the use of an external processing resource. Therefore, the sensing circuitry 150 may be used to complement and to replace, at least to some extent, such an external processing resource (or at least the bandwidth consumption of such an external processing resource).

Figure 2A:
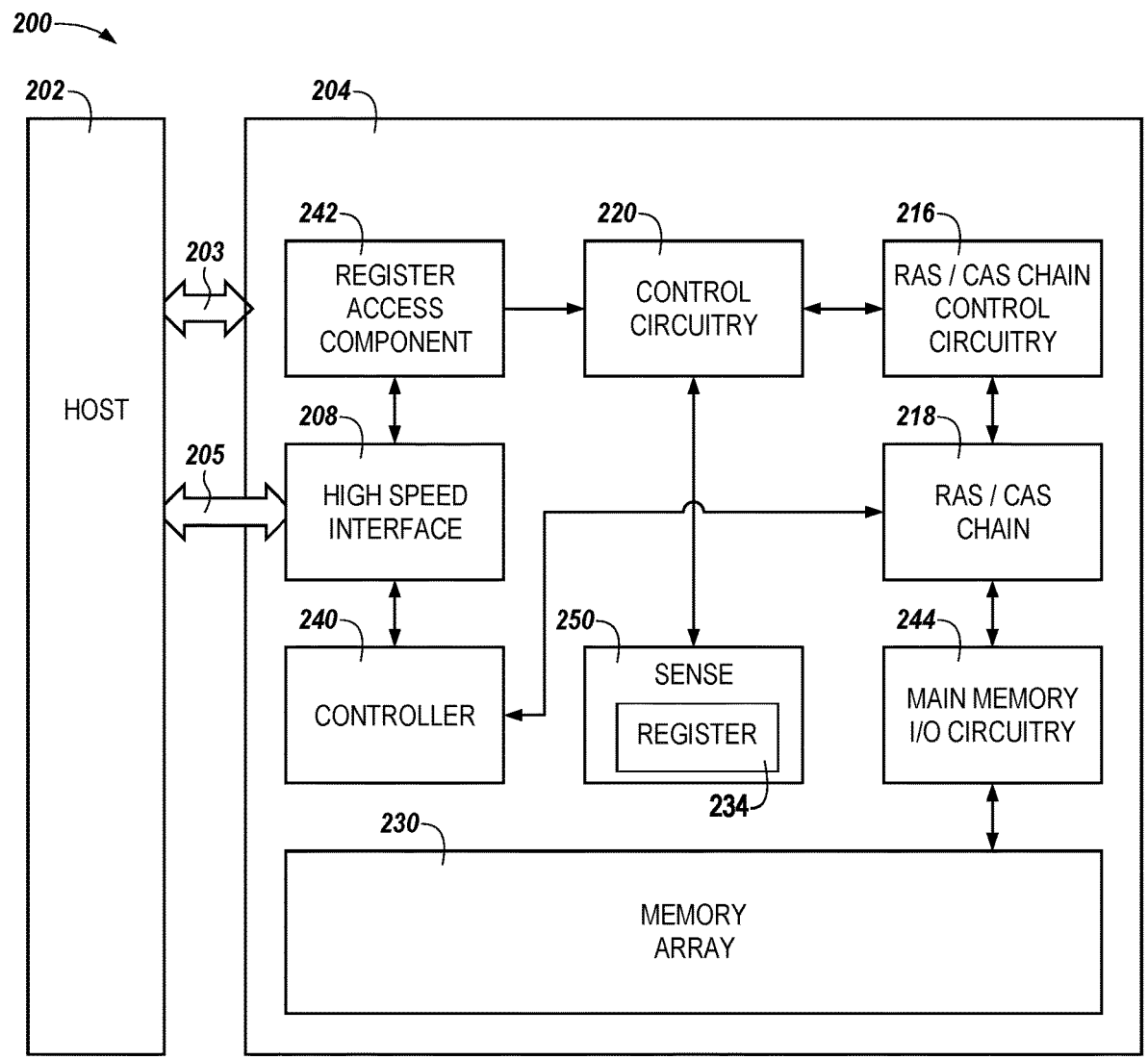
FIG. 2A is a functional block diagram in the form of a computing system including an apparatus including a host and a memory device in accordance with a number of embodiments of the present disclosure.

FIG. 2A is a functional block diagram in the form of a computing system including an apparatus 200 including a host 202 and a memory device 204 in accordance with a number of embodiments of the present disclosure. The memory device 204 can include control circuitry 220, which can be analogous to the control circuitry 120 illustrated in FIGS. 1A and 1B. Similarly, the host 202 can be analogous to the host 102 illustrated in FIGS. 1A and 1B, and the memory device 204 can be analogous to the memory device 104 illustrated in FIGS. 1A and 1B. Each of the components (e.g., the host 202, the control circuitry 220, the sensing circuitry 250, and/or the memory array 230, etc.) can be separately referred to herein as an "apparatus."

The host 202 can be communicatively coupled to the memory device 204 via one or more channels 203, 205. The channels 203, 205 can be interfaces or other physical connections that allow for data and/or commands to be transferred between the host 202 and the memory device 205. For example, commands to cause initiation of an operation (e.g., an operation to convert one or more bit strings from a first format to a second format (or vice versa), an operation to cause the bit strings to be loaded into the sensing circuitry 250 to perform an arithmetic and/or logical operation, etc.) to be performed using the control circuitry 220 can be transferred from the host via the channels 203, 205. It is noted that, in some embodiments, the control circuitry 220 can perform the operations in response to an initiation command transferred from the host 202 via one or more of the channels 203, 205 in the absence of an intervening command from the host 202. That is, once the control circuitry 220 has received the command to initiate performance of an operation from the host 202, the operations can be performed by the control circuitry 220 in the absence of additional commands from the host 202.

As shown in FIG. 2A, the memory device 204 can include a register access component 242, a high speed interface (HSI) 208, a controller 240, sensing circuitry 250, main memory input/output (I/O) circuitry 244, row address strobe (RAS)/column address strobe (CAS) chain control circuitry 216, a RAS/CAS chain component 218, control circuitry 220, and a memory array 230. The sensing circuitry 250 and/or the control circuitry 220 are, as shown in FIG. 2, located in an area of the memory device 204 that is physically distinct from the memory array 230. That is, in some embodiments, the sensing circuitry 250 and/or the control circuitry 220 are located in a periphery location of the memory array 230.

The register access component 242 can facilitate transferring and fetching of data from the host 202 to the memory device 204 and from the memory device 204 to the host 202. For example, the register access component 242 can store addresses (or facilitate lookup of addresses), such as memory addresses, that correspond to data that is to be transferred to the host 202 from the memory device 204 or transferred from the host 202 to the memory device 204. In some embodiments, the register access component 242 can facilitate transferring and fetching data that is to be operated upon by the control circuitry 220 and/or the register access component 242 can facilitate transferring and fetching data that is has been operated upon by the control circuitry 220, or in response to an action taken by the control circuitry 220, for transfer to the host 202.

The HSI 208 can provide an interface between the host 202 and the memory device 204 for commands and/or data traversing the channel 205. The HSI 208 can be a double data rate (DDR) interface such as a DDR3, DDR4, DDR5, etc. interface. Embodiments are not limited to a DDR interface, however, and the HSI 208 can be a quad data rate (QDR) interface, peripheral component interconnect (PCI) interface (e.g., a peripheral component interconnect express (PCIe)) interface, or other suitable interface for transferring commands and/or data between the host 202 and the memory device 204.

The controller 240 can be responsible for executing instructions from the host 202 and accessing the control circuitry 220 and/or the memory array 230. The controller 240 can be a state machine, a sequencer, or some other type of controller. The controller 240 can receive commands from the host 202 (via the HSI 208, for example) and, based on the received commands, control operation of the control circuitry 220 and/or the memory array 230. In some embodiments, the controller 240 can receive a command from the host 202 to cause performance of an operation using the control circuitry 220. Responsive to receipt of such a command, the controller 240 can instruct the control circuitry 220 to begin performance of the operation(s).

In some embodiments, the controller 240 can be a global processing controller and may provide power management functions to the memory device 204. Power management functions can include control over power consumed by the memory device 204 and/or the memory array 230. For example, the controller 240 can control power provided to various banks of the memory array 230 to control which banks of the memory array 230 are operational at different times during operation of the memory device 204. This can include shutting certain banks of the memory array 230 down while providing power to other banks of the memory array 230 to optimize power consumption of the memory device 230. In some embodiments, the controller 240 controlling power consumption of the memory device 204 can include controlling power to various cores of the memory device 204 and/or to the control circuitry 220, the memory array 230, etc.

As mentioned above, the sensing circuitry 250 can provide additional storage space for the memory array 230 and can sense (e.g., read, store, cache) data values that are present in the memory device 204. The sensing circuitry 250 can include sense amplifiers, latches, flip-flops, etc. that can be configured to perform operations (e.g., arithmetic and/or logical operations) using the bit strings. For example, the sensing circuitry 250 can include a register 234 (e.g., which can include multiple registers) that can temporarily store bit strings and/or intermediate results from the memory array 230 and/or the memory resource 124 illustrated in FIG. 1.

As shown in FIG. 2A, the sensing circuitry 250 is in a location of the memory device 204 that is physically distinct from the memory array 230. In some embodiments, the sensing circuitry 250 can be provided in the form of a register or series of registers and can include a same quantity of sense amplifiers and/or compute components as there are rows or columns of the memory array 230. For example, if the memory array 230 contains around 16K rows or columns, the sensing circuitry 250 can include around 16K storage locations. Accordingly, in some embodiments, the sensing component 250 can be a register that is configured to hold up to around 16K data values.

However, embodiments are not limited to scenarios in which the sensing circuitry 250 includes around 16K location in which to store data values. For example, the sensing component 250 can be configured to store around 2K data values, around 4K data values, around 8K data values, etc. Further, although a single box is shown as illustrating the sensing component 250 in FIG. 2A, in some embodiments there can be more that a single "row" of sensing components 250. For example, there may be two, four, or eight, among other quantities, of "rows" of sensing components 250 that can each be configured to store around 2K data values, around 4K data values, around 8K data values, around 16K data values, etc.

As described in more detail in connection with FIG. 6, the sensing circuitry 250 can be configured to facilitate performance of arithmetic and/or logical operations between bit strings (e.g., bit string in the universal number format or the posit format) that are stored in the memory array 230. For example, once the bit strings have been converted to the second format (e.g., the universal number format or the posit format) by the control circuitry 220 and stored in the memory array 230, the sensing circuitry 250 can perform the operations using the converted bit strings to perform arithmetic and/or logical operations using the converted bit strings.

The main memory input/output (I/O) circuitry 244 can facilitate transfer of data and/or commands to and from the memory array 230. For example, the main memory I/O circuitry 244 can facilitate transfer of bit strings, data, and/or commands from the host 202 and/or the control circuitry 220 to and from the memory array 230. In some embodiments, the main memory I/O circuitry 214 can include one or more direct memory access (DMA) components that can transfer the bit strings (e.g., posit bit strings stored as blocks of data) from the control circuitry 220 to the memory array 230, and vice versa.

In some embodiments, the main memory I/O circuitry 244 can facilitate transfer of bit strings, data, and/or commands from the memory array 230 to the control circuitry 220 so that the control circuitry 220 can perform operations on the bit strings. Similarly, the main memory I/O circuitry 244 can facilitate transfer of bit strings that have had one or more operations performed on them by the control circuitry 220 to the memory array 230. As described in more detail herein, the operations can include various arithmetic operations, such as a multiplication operation, using bit strings (e.g., universal number bit strings, posit bit strings, floating-point bit strings, and/or fixed-point binary bit strings).

As described above, posit bit strings (e.g., the data) can be stored and/or retrieved from the memory array 230. In some embodiments, the main memory I/O circuitry 244 can facilitate storing and/or retrieval of the posit bit strings to and/or from the memory array 230. For example, the main memory I/O circuitry 244 can be enabled to transfer posit bit strings to the memory array 230 to be stored, and/or the main memory I/O circuitry 244 can facilitate retrieval of the posit bit strings (e.g., posit bit strings representing a performed operation between one or more posit bit string operands) from the memory array 230 in response to, for example, a command from the controller 210 and/or the control circuitry 220.

The row address strobe (RAS)/column address strobe (CAS) chain control circuitry 216 and the RAS/CAS chain component 218 can be used in conjunction with the memory array 230 to latch a row address and/or a column address to initiate a memory cycle. In some embodiments, the RAS/CAS chain control circuitry 216 and/or the RAS/CAS chain component 218 can resolve row and/or column addresses of the memory array 230 at which read and write operations associated with the memory array 230 are to be initiated or terminated. For example, upon completion of an operation using the control circuitry 220, the RAS/CAS chain control circuitry 216 and/or the RAS/CAS chain component 218 can latch and/or resolve a specific location in the periphery sense amplifiers 211 and/or the memory array 230 to which the bit strings that have been operated upon by the control circuitry 220 are to be stored. Similarly, the RAS/CAS chain control circuitry 216 and/or the RAS/CAS chain component 218 can latch and/or resolve a specific location in the periphery sense amplifiers 211 and/or the memory array 230 from which bit strings are to be transferred to the control circuitry 220 prior to, or subsequent to, the control circuitry 220 performing an operation (e.g., a recursive operation) on the bit string(s).

The control circuitry 220 can include logic circuitry (e.g., the logic circuitry 122 illustrated in FIG. 1) and/or memory resource(s) (e.g., the memory resource 124 illustrated in FIG. 1). Bit strings (e.g., data, a plurality of bits, etc.) can be received by the control circuitry 220 from, for example, the host 202, the memory array 230, and/or an external memory device and stored by the control circuitry 220, for example in the memory resource of the control circuitry 220.

In some embodiments, once the bit strings have been converted to the float-point format or the fixed-point binary format by the control circuitry 220 and stored in the memory array 230, the memory array 230 can, in conjunction with the sensing circuitry 250, perform (or cause performance of) arithmetic and/or logical operations on the universal number or posit bit strings. For example, the sensing circuitry 250, which is further described below in connection with FIG. 6, can be configured to perform (or cause performance of) arithmetic operations such as additions, subtractions, multiplications, divisions, fused multiply addition operations, multiply-accumulate operations, dot product operations, greater than or less than, absolute value (e.g., FABS( )), fast Fourier transforms, inverse fast Fourier transforms, sigmoid function operations, convolution operations, square root operations, exponent operations, and/or logarithm operations, and/or logical operations such as AND, OR, XOR, NOT, etc., as well as trigonometric operations such as sine, cosine, tangent, etc. As will be appreciated, the foregoing list of operations is not intended to be exhaustive, nor is the foregoing list of operations intended to be limiting, and the control circuitry 220 may be configured to perform (or cause performance of) other arithmetic and/or logical operations using universal number or posit bit strings.

In some embodiments, the sensing circuitry 250 may perform the above-listed operations in conjunction with execution of one or more machine learning algorithms. For example, the sensing circuitry 250 may perform operations related to one or more neural networks. Neural networks may allow for an algorithm to be trained over time to determine an output response based on input signals. For example, over time, a neural network may essentially learn to better maximize the chance of completing a particular goal. This may be advantageous in machine learning applications because the neural network may be trained over time with new data to achieve better maximization of the chance of completing the particular goal. A neural network may be trained over time to improve operation of particular tasks and/or particular goals. Although machine learning (e.g., neural network training) may be processing intensive (e.g., may consume large amounts of computer processing resources) and/or may be time intensive (e.g., may require lengthy calculations that consume multiple cycles to be performed), embodiments described herein can provide flexibility in selecting a format (e.g., unum format or posit format, and/or floating-point format or fixed-point binary format) to perform arithmetic and/or logical operations with, and/or reduced processing time in performing the operations (e.g., by performing multiple operations in and/or without transferring data of operands off the chip), which can provided improved performance of operations associated with the neural network.

In some embodiments, the controller 210 can be configured to cause the control circuitry 220 and/or the sensing circuitry 250 to perform operations using bit strings without encumbering the host 202 (e.g., without receiving an intervening command or a command separate from a command to initiate performance of the operation from the host 202 and/or without transferring results of the operations to the host 202), although embodiments are not so limited.

As described above in connection with FIG. 1, the memory array 230 can be a DRAM array, SRAM array, STT RAM array, PCRAM array, TRAM array, RRAM array, NAND flash array, and/or NOR flash array, for instance, although embodiments are not limited to these particular examples. The memory array 230 can function as main memory for the computing system 200 shown in FIGS. 2A and 2B. In some embodiments, the memory array 230 can be configured to perform arithmetic and/or logical operations using bit string stored therein, store results of the arithmetic and/or logical operations, and/or store bit strings to be transferred to the control circuitry 220 prior to performance of conversion operations using the bit strings.

In some embodiments, bit strings (e.g., posit bit strings) can be generated and/or stored in the memory array 230 without encumbering the host 202. For example, the bit strings can be generated and/or stored in the memory array 230 without receiving multiple commands from the host 202. Stated alternatively, in some embodiments, the host 202 can send a single command to the memory device to request performance of an operation using one or more bit strings. Responsive to receipt of the command to request performance of the operation, the memory device 204 (e.g., the controller 210, the control circuitry 220, or other components of the memory device 204) can perform the operation and/or retrieve a stored result of the operation in the absence of additional commands from the host 202. This can reduce traffic across the channels 203/205, which can increase performance of a computing device associated with the host 202 and/or the memory device 204.

In a non-limiting example, the sensing circuitry 250 can include a sense amplifier (e.g., the sense amplifier 649 illustrated in FIG. 6) and a compute component (e.g., the compute component 665 illustrated in FIG. 6) and may be coupled to the memory array 230. In this example, a first bit string having a first numerical value associated therewith and a second bit string having a second numerical value associated therewith can be stored in a respective first row and second row of the memory array. A counter (e.g., the counter 114 illustrated in FIG. 1A) can be communicatively coupled to the sensing circuitry 250 and the memory array, and the control circuitry 220 can be coupled to the counter, the sensing circuitry 250, and the memory array 230. In this example, the control circuitry 220 can be configured to store an initial value within (e.g., initialize) the counter and cause the sensing circuitry 250 to perform a number of iterations of an arithmetic operation using the first bit string, the second bit string, or a third bit string, or any combination thereof based, at least in part, on the value stored by the counter. In some embodiments, the control circuitry 220 is configured to write the second bit string to a register of the sensing circuitry 250 and decrement the value (e.g., initial value) of the counter in response to writing the second bit string to the third row such that, for example, the number of iterations described below can be performed based on the decremented counter value.

For each one of the number of iterations, the sensing circuitry 250 is configured to perform an addition operation by adding a greater one of the second numerical value and a third numerical value to the first numerical value and store a result of the addition operation in the second row or the third row of the memory array whose corresponding bit string is not used as an operand of a preceding addition operation. The third bit strings can have the third numerical value associated therewith and is stored in a third row of the memory array.

The multiplication operation is performed as a result of performance of the number of iterations with operands of the first numerical value, the second numerical value, or the third numerical value, or any combination thereof. A result of the number of iterations stored on the second row or the third row corresponds to a result of multiplication operation. In some embodiments, the result of the multiplication operation is stored in the second row or the third row in which a result of a last one of the number of iterations is stored.

In some embodiments, the counter can be updated according to the status of the multiplication operation and/or the number of iterations performed for the multiplication operation. For example, the control circuitry 220 can be configured to decrement the counter for each of the number of iterations and cause the sensing circuitry 250 to perform the number of iterations until a value of the counter reaches a value of 1 such that the number of times specified in the counter corresponds to the second numerical value being less 1.

In some embodiments, the control circuitry 220 can be configured to store (e.g., while a number of iterations are being performed within the memory array) a sign bit indicating whether the result of the multiplication operation is of a positive or a negative numerical value. For example, in response to receiving bit strings from the memory array 230, the control circuitry 220 can be configured to determine whether a result of the operation using the bit strings as operands would be of a positive or a negative numerical value. Upon the determination, the bit strings can be transferred back to the memory array 230, and the control circuitry 220 can be configured to store a resultant sign bit while the operation is being performed within the memory array 230 (e.g., such that the control circuitry 220 can associate the resultant sign bit to a result of the operation).

In some embodiments, the control circuitry 220 further includes logic circuitry (e.g., logic circuitry 122 illustrated in FIG. 1A), and the control circuitry 220 is configured to, prior to the first bit string being written to the first row and the second row, retrieve the first bit string and the second bit string that are in a first format from the memory array and cause the logic circuitry to perform an operation to convert the first bit string and the second bit string from the first format to a second format. The control circuitry 220 is further configured to transfer, to the sensing circuitry, the first bit string and the second bit string having the converted second format such that the number of iterations is performed while the first bit string and the second bit string are in the second format. For example, the first format includes an IEEE 754 format, a fixed-point binary format, or a decimal format and the second format includes a universal number format or a posit format. Subsequently (e.g., subsequent to the number of iterations), the control circuitry 220 can be configured to retrieve the result of the multiplication operation having the second format from the sensing circuitry and cause the logic circuitry to perform an operation to convert the result of the multiplication from the second format to the first format. Upon the conversion of the result, the control circuitry 220 can be configured to cause the sensing circuitry to store the result of the multiplication operation in the memory array such that the result of the multiplication is stored in the first format.

In another non-limiting example, logic circuitry (e.g., logic circuitry 122 illustrated in FIG. 1A) can be coupled to a memory array 230, a counter coupled to the logic circuitry and the memory array 230, and a control circuitry 220 coupled to the counter, the logic circuitry, and the memory array 230. As part of performance of a multiplication operation invoking a plurality of bit strings formatted according to a universal number or posit format, the control circuitry 220 can be configured to initialize the counter to have a first counter value and write a first bit string and a second bit string respectively to a first row of the memory array 230 and a second row of the memory array 230.

In response to writing the first bit string and the second bit string, the control circuitry 220 can be further configured to decrement the first counter value to a second counter value and cause performance of a first addition operation using, as operands, the first bit string and the second bit string. In this example, the control circuitry, as part of performance of the first addition operation, can be configured to decrement the counter in response to completion of the first addition operation and write a result of the first addition operation to a third row of the memory array 230. Subsequently, the control circuitry 220 can be configured to cause performance of a second addition operation using, as operands, the first bit string and the result of the first addition operation stored in the third row of the memory array 230. In this example, the control circuitry, as part of performance of the first addition operation, can be configured to decrement the counter in response to completion of the second addition operation and write a result of the second addition operation to the second row of the memory array 230. The control circuitry 220 can be further configured to determine that the counter has been decremented to a value indicative of completion of the multiplication operation.

In response to a determination that the result of the addition operation stored in the second row of the memory array 230 has a greater numerical value corresponding thereto than the result of the addition operation stored in the third row, the result of the addition operation stored in the second row can be written to circuitry external to the memory array 230. Alternatively, in response to a determination that the result of the addition operation stored in the third row of the memory array 230 has a greater numerical value corresponding thereto than the result of the addition operation stored in the second row, the result of the addition operation stored in the third row can be written to the circuitry external to the memory array 230.

Prior to writing the result of the addition operation stored in the second row or the result of the addition operation stored in the third row to the circuitry external to the array, the logic circuitry is configured to perform an operation to convert the result of the addition operation stored in the second row or the result of the addition operation stored in the third row from the universal number or posit format to an IEEE 754 floating-point format or a fixed-point binary format.

In some embodiments, the control circuitry 220 can be configured to perform a multiplication operation among a plurality of bit strings having a same bit length. The control circuitry 220 is configured to determine that at least two of the one or more of the plurality of bit strings have a same bit length for a exponent bit sub-set, and perform the multiplication operation using the at least two of the one or more of the plurality of bit strings in response to the determination.

Figure 2B:
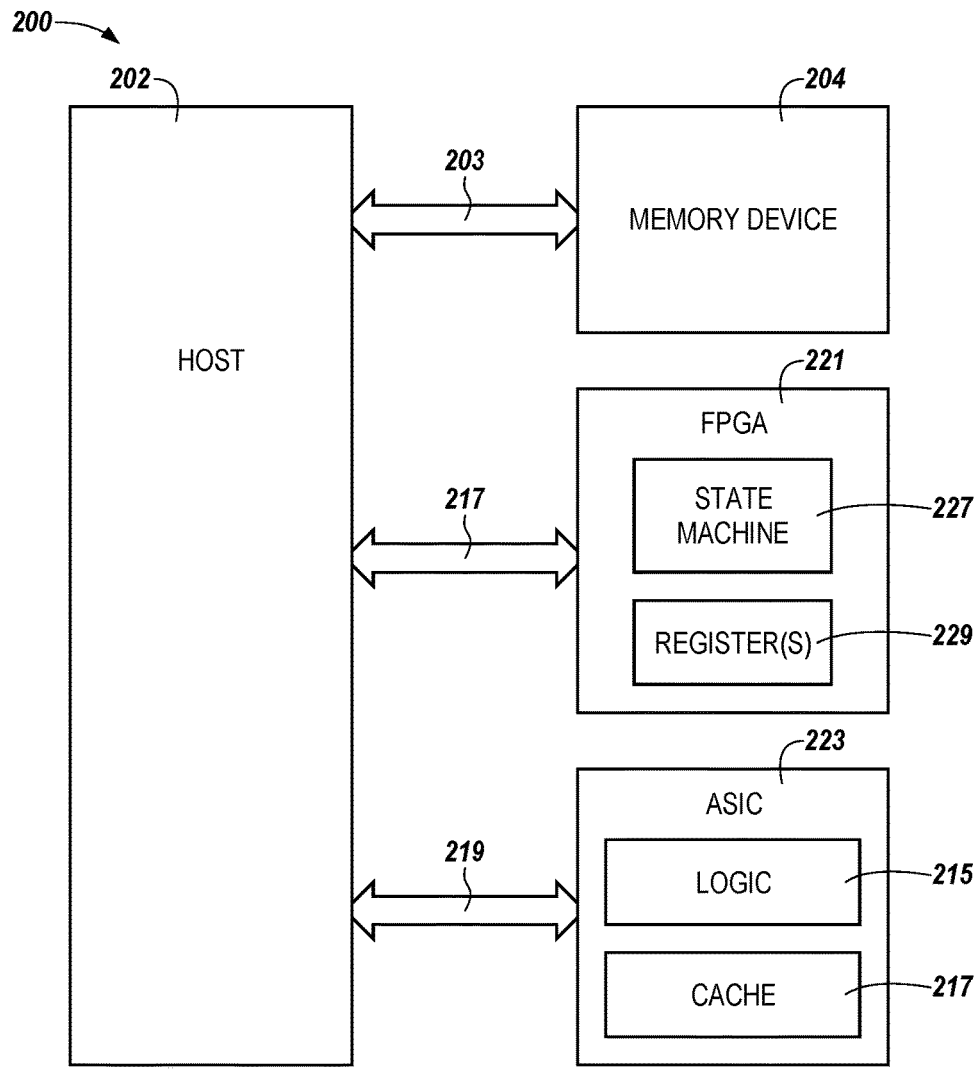
FIG. 2B is another functional block diagram in the form of a computing system including a host, a memory device, an application-specific integrated circuit, and a field programmable gate array in accordance with a number of embodiments of the present disclosure.

FIG. 2B is a functional block diagram in the form of a computing system 200 including a host 202, a memory device 204, an application-specific integrated circuit 223, and a field programmable gate array 221 in accordance with a number of embodiments of the present disclosure. Each of the components (e.g., the host 202, the memory device 204, the FPGA 221, the ASIC 223, etc.) can be separately referred to herein as an "apparatus."

As shown in FIG. 2B, the host 202 can be coupled to the memory device 204 via channel(s) 203, which can be analogous to the channel(s) 203 illustrated in FIG. 2A. The field programmable gate array (FPGA) 221 can be coupled to the host 202 via channel(s) 217 and the application-specific integrated circuit (ASIC) 223 can be coupled to the host 202 via channel(s) 219. In some embodiments, the channel(s) 217 and/or the channel(s) 219 can include a peripheral serial interconnect express (PCIe) interface, however, embodiments are not so limited, and the channel(s) 217 and/or the channel(s) 219 can include other types of interfaces, buses, communication channels, etc. to facilitate transfer of data between the host 202 and the FPGA 221 and/or the ASIC 223.

Figure 6:
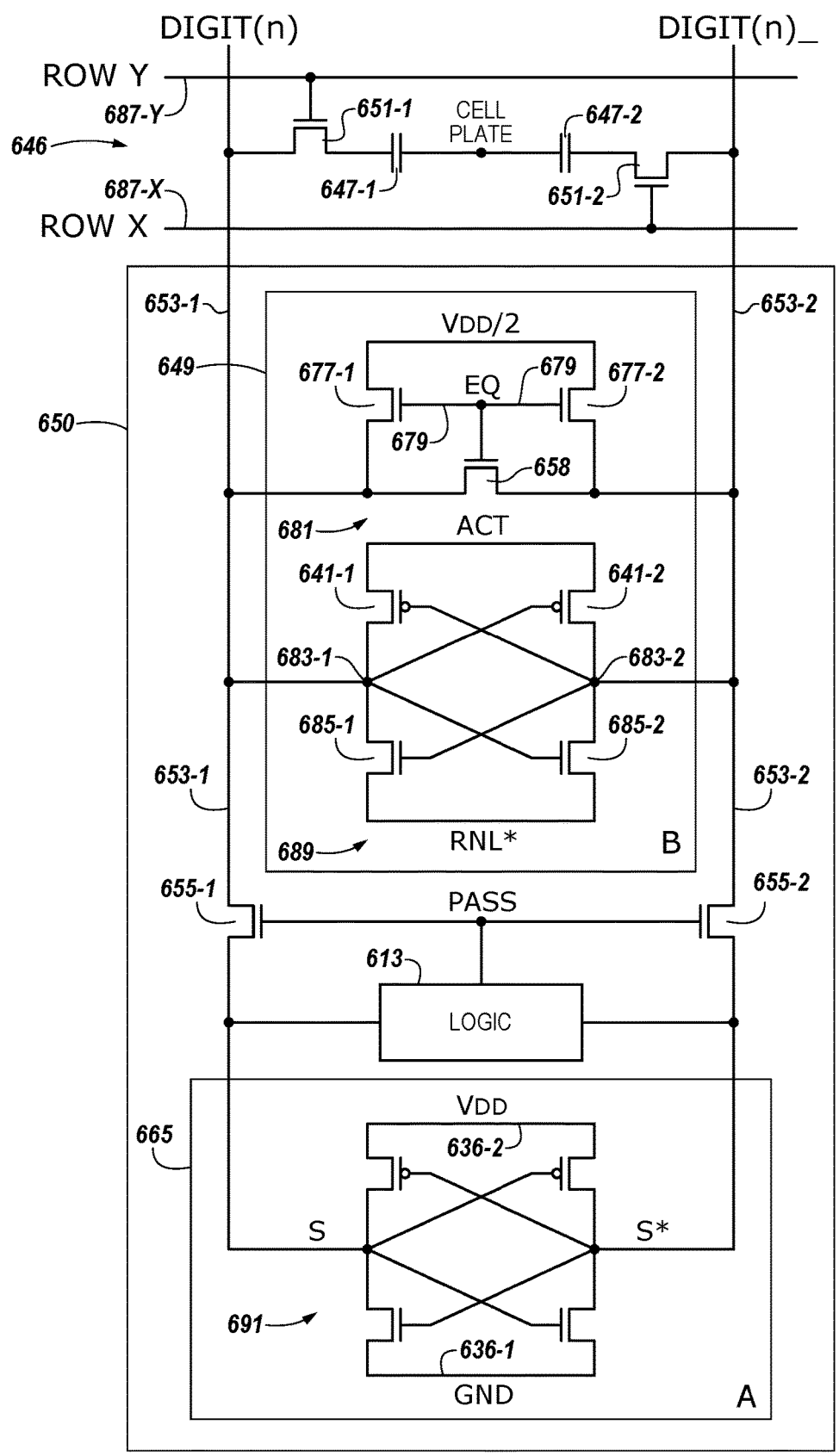
FIG. 6 is a schematic diagram illustrating a portion of a memory array including sensing circuitry in accordance with a number of embodiments of the present disclosure.

As described above, circuitry located on the memory device 204 (e.g., the control circuitry 220 and/or memory array 230 illustrated in FIG. 2A, as well as the sensing component 250/650 illustrated in FIGS. 2A and 6 ) can perform operations (e.g., operations to convert the bit strings between various formats, arithmetic operations and/or logical operations using the bit strings, etc.) using bit strings formatted in a universal number format or a posit format. Embodiments are not so limited, however, and in some embodiments, the operation(s) can be performed by the FPGA 221 and/or the ASIC 223. As described above, non-limiting examples of arithmetic and/or logical operations that can be performed by the FPGA 221 and/or the ASIC 223 include arithmetic operations such as addition, subtraction, multiplication, division, fused multiply addition, multiply-accumulate, dot product units, greater than or less than, absolute value (e.g., FABS( ), fast Fourier transforms, inverse fast Fourier transforms, sigmoid function, convolution, square root, exponent, and/or logarithm operations, and/or logical operations such as AND, OR, XOR, NOT, etc., as well as trigonometric operations such as sine, cosine, tangent, etc. using the posit bit strings.

The FPGA 221 can include a state machine 227 and/or register(s) 229. The state machine 227 can include one or more processing devices that are configured to perform operations on an input and produce an output. For example, the FPGA 221 can be configured to receive posit bit strings from the host 202 or the memory device 204 and perform one or more operations using the universal number format or posit format bit strings. The register(s) 229 of the FPGA 221 can be configured to buffer and/or store the posit bit strings received form the host 202 prior to the state machine 227 performing operations using the received bit strings. In addition, the register(s) 229 of the FPGA 221 can be configured to buffer and/or store intermediate results of iterations of recursive operations performed by the FPGA 221 prior to transferring the result to circuitry external to the ASIC 233, such as the host 202 or the memory device 204, etc.

The ASIC 223 can include logic 215 and/or a cache 217. The logic 215 can include circuitry configured to perform operations on an input and produce an output. In some embodiments, the ASIC 223 is configured to receive universal number format or posit format bit strings from the host 202 and/or the memory device 204 and perform one or more operations using posit bit string operands. The cache 217 of the ASIC 223 can be configured to buffer and/or store the bit strings received form the host 202 prior to the logic 215 performing an operation on the received bit strings. In addition, the cache 217 of the ASIC 223 can be configured to buffer and/or store intermediate results of iterations of recursive operations using the bit strings prior to transferring the result to circuitry external to the ASIC 233, such as the host 202 or the memory device 204, etc.

Although the FPGA 227 is shown as including a state machine 227 and register(s) 229, in some embodiments, the FPGA 221 can include logic, such as the logic 215, and/or a cache, such as the cache 217 in addition to, or in lieu of, the state machine 227 and/or the register(s) 229. Similarly, the ASIC 223 can, in some embodiments, include a state machine, such as the state machine 227, and/or register(s), such as the register(s) 229 in addition to, or in lieu of, the logic 215 and/or the cache 217.

Figure 3:
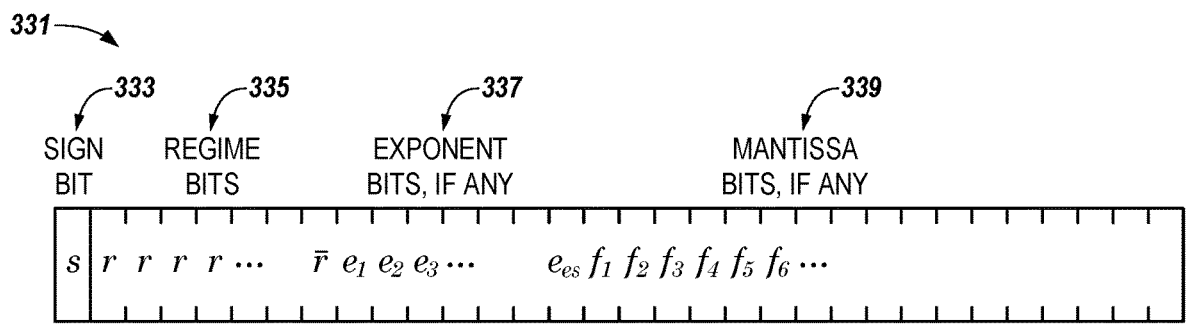
FIG. 3 is an example of an n-bit post with es exponent bits.

FIG. 3 is an example of an n-bit universal number, or "unum" with es exponent bits. In the example of FIG. 3, the n-bit unum is a posit bit string 331. As shown in FIG. 3, the n-bit posit 331 can include a set of sign bit(s) (e.g., a first bit sub-set or a sign bit sub-set 333), a set of regime bits (e.g., a second bit sub-set or the regime bit sub-set 335), a set of exponent bits (e.g., a third bit sub-set or an exponent bit sub-set 337), and a set of mantissa bits (e.g., a fourth bit sub-set or a mantissa bit sub-set 339 ). The mantissa bits 339 can be referred to in the alternative as a "fraction portion" or as "fraction bits," and can represent a portion of a bit string (e.g., a number) that follows a decimal point.

The sign bit 333 can be zero (0) for positive numbers and one (1) for negative numbers. The regime bits 335 are described in connection with Table 1, below, which shows (binary) bit strings and their related numerical meaning, k. In Table 1, the numerical meaning, k, is determined by the run length of the bit string. The letter x in the binary portion of Table 1 indicates that the bit value is irrelevant for determination of the regime, because the (binary) bit string is terminated in response to successive bit flips or when the end of the bit string is reached. For example, in the (binary) bit string 0010, the bit string terminates in response to a zero flipping to a one and then back to a zero. Accordingly, the last zero is irrelevant with respect to the regime and all that is considered for the regime are the leading identical bits and the first opposite bit that terminates the bit string (if the bit string includes such bits).

TABLE 1

| Binary | 0000 | 0001 | 001X | 01XX | 10XX | 110X | 1110 | 1111 |
|---|---|---|---|---|---|---|---|---|
| Numerical (k) | −4 | −3 | −2 | −1 | 0 | 1 | 2 | 3 |

In FIG. 3, the regime bits 335 r correspond to identical bits in the bit string, while the regime bits 335 r̄ correspond to an opposite bit that terminates the bit string. For example, for the numerical k value −2 shown in Table 1, the regime bits r correspond to the first two leading zeros, while the regime bit(s) r correspond to the one. As noted above, the final bit corresponding to the numerical k, which is represented by the X in Table 1 is irrelevant to the regime.

If m corresponds to the number of identical bits in the bit string, if the bits are zero, k=−m. If the bits are one, then k=m−1. This is illustrated in Table 1 where, for example, the (binary) bit string 10XX has a single one and k=m−1=1−1=0. Similarly, the (binary) bit string 0001 includes three zeros so k=−m=−3. The regime can indicate a scale factor of $useed^k$, where $useed=2^{2^{es}}$. Several example values for used are shown below in Table 2.

TABLE 2

| es | 0 | 1 | 2 | 3 | 4 |
|---|---|---|---|---|---|
| used | 2 | $2^2 = 4$ | $4^2 = 16$ | $16^2 = 256$ | $256^2 = 65536$ |

The exponent bits 337 correspond to an exponent e, as an unsigned number. In contrast to floating-point numbers, the exponent bits 337 described herein may not have a bias associated therewith. As a result, the exponent bits 337 described herein may represent a scaling by a factor of $2^e$. As shown in FIG. 3, there can be up to es exponent bits ($e_1$, $e_2$, $e_3$, ..., $e_{es}$), depending on how many bits remain to right of the regime bits 335 of the n-bit posit 331. In some embodiments, this can allow for tapered accuracy of the n-bit posit 331 in which numbers which are nearer in magnitude to one have a higher accuracy than numbers which are very large or very small. However, as very large or very small numbers may be utilized less frequent in certain kinds of operations, the tapered accuracy behavior of the n-bit posit 331 shown in FIG. 3 may be desirable in a wide range of situations.

The mantissa bits 339 (or fraction bits) represent any additional bits that may be part of the n-bit posit 331 that lie to the right of the exponent bits 337. Similar to floating-point bit strings, the mantissa bits 339 represent a fraction f, which can be analogous to the fraction 1.f where f includes one or more bits to the right of the decimal point following the one. In contrast to floating-point bit strings, however, in the n-bit posit 331 shown in FIG. 3, the "hidden bit" (e.g., the one) may always be one (e.g., unity), whereas floating-point bit strings may include a subnormal number with a "hidden bit" of zero (e.g., 0.f).

As described herein, alter a numerical value or a quantity of bits of one of more of the sign 333 bit sub-set, the regime 335 bit sub-set, the exponent 337 bit sub-set, or the mantissa 339 bit sub-set can vary the precision of the n-bit posit 331. For example, changing the total number of bits in the n-bit posit 331 can alter the resolution of the n-bit posit bit string 331. That is, an 8-bit posit can be converted to a 16-bit posit by, for example, increasing the numerical values and/or the quantity of bits associated with one or more of the posit bit string's constituent bit sub-sets to increase the resolution of the posit bit string. Conversely, the resolution of a posit bit string can be decreased for example, from a 64-bit resolution to a 32-bit resolution by decreasing the numerical values and/or the quantity of bits associated with one or more of the posit bit string's constituent bit sub-sets.

In some embodiments, altering the numerical value and/or the quantity of bits associated with one or more of the regime 335 bit sub-set, the exponent 337 bit sub-set, and/or the mantissa 339 bit sub-set to vary the precision of the n-bit posit 331 can lead to an alteration to at least one of the other of the regime 335 bit sub-set, the exponent 337 bit sub-set, and/or the mantissa 339 bit sub-set. For example, when altering the precision of the n-bit posit 331 to increase the resolution of the n-bit posit bit string 331 (e.g., when performing an "up-convert" operation to increase the bit width of the n-bit posit bit string 331), the numerical value and/or the quantity of bits associated with one or more of the regime 335 bit sub-set, the exponent 337 bit sub-set, and/or the mantissa 339 bit sub-set may be altered.

In a non-limiting example in which the resolution of the n-bit posit bit string 331 is increased (e.g., the precision of the n-bit posit bit string 331 is varied to increase the bit width of the n-bit posit bit string 331) but the numerical value or the quantity of bits associated with the exponent 337 bit sub-set does not change, the numerical value or the quantity of bits associated with the mantissa 339 bit sub-set may be increased. In at least one embodiment, increasing the numerical value and/or the quantity of bits of the mantissa 339 bit sub-set when the exponent 338 bit sub-set remains unchanged can include adding one or more zero bits to the mantissa 339 bit sub-set.

In another non-limiting example in which the resolution of the n-bit posit bit string 331 is increased (e.g., the precision of the n-bit posit bit string 331 is varied to increase the bit width of the n-bit posit bit string 331) by altering the numerical value and/or the quantity of bits associated with the exponent 337 bit sub-set, the numerical value and/or the quantity of bits associated with the regime 335 bit sub-set and/or the mantissa 339 bit sub-set may be either increased or decreased. For example, if the numerical value and/or the quantity of bits associated with the exponent 337 bit sub-set is increased or decreased, corresponding alterations may be made to the numerical value and/or the quantity of bits associated with the regime 335 bit sub-set and/or the mantissa 339 bit sub-set. In at least one embodiment, increasing or decreasing the numerical value and/or the quantity of bits associated with the regime 335 bit sub-set and/or the mantissa 339 bit sub-set can include adding one or more zero bits to the regime 335 bit sub-set and/or the mantissa 339 bit sub-set and/or truncating the numerical value or the quantity of bits associated with the regime 335 bit sub-set and/or the mantissa 339 bit sub-set.

In another example in which the resolution of the n-bit posit bit string 331 is increased (e.g., the precision of the n-bit posit bit string 331 is varied to increase the bit width of the n-bit posit bit string 331), the numerical value and/or the quantity of bits associated with the exponent 335 bit sub-set may be increased and the numerical value and/or the quantity of bits associated with the regime 333 bit sub-set may be decreased. Conversely, in some embodiments, the numerical value and/or the quantity of bits associated with the exponent 335 bit sub-set may be decreased and the numerical value and/or the quantity of bits associated with the regime 333 bit sub-set may be increased.

In a non-limiting example in which the resolution of the n-bit posit bit string 331 is decreased (e.g., the precision of the n-bit posit bit string 331 is varied to decrease the bit width of the n-bit posit bit string 331) but the numerical value or the quantity of bits associated with the exponent 337 bit sub-set does not change, the numerical value or the quantity of bits associated with the mantissa 339 bit sub-set may be decreased. In at least one embodiment, decreasing the numerical value and/or the quantity of bits of the mantissa 339 bit sub-set when the exponent 338 bit sub-set remains unchanged can include truncating the numerical value and/or the quantity of bits associated with the mantissa 339 bit sub-set.

In another non-limiting example in which the resolution of the n-bit posit bit string 331 is decreased (e.g., the precision of the n-bit posit bit string 331 is varied to decrease the bit width of the n-bit posit bit string 331) by altering the numerical value and/or the quantity of bits associated with the exponent 337 bit sub-set, the numerical value and/or the quantity of bits associated with the regime 335 bit sub-set and/or the mantissa 339 bit sub-set may be either increased or decreased. For example, if the numerical value and/or the quantity of bits associated with the exponent 337 bit sub-set is increased or decreased, corresponding alterations may be made to the numerical value and/or the quantity of bits associated with the regime 335 bit sub-set and/or the mantissa 339 bit sub-set. In at least one embodiment, increasing or decreasing the numerical value and/or the quantity of bits associated with the regime 335 bit sub-set and/or the mantissa 339 bit sub-set can include adding one or more zero bits to the regime 335 bit sub-set and/or the mantissa 339 bit sub-set and/or truncating the numerical value or the quantity of bits associated with the regime 335 bit sub-set and/or the mantissa 339 bit sub-set.

In some embodiments, changing the numerical value and/or a quantity of bits in the exponent bit sub-set can alter the dynamic range of the n-bit posit 331. For example, a 32-bit posit bit string with an exponent bit sub-set having a numerical value of zero (e.g., a 32-bit posit bit string with es=0, or a (32,0) posit bit string) can have a dynamic range of approximately 18 decades. However, a 32-bit posit bit string with an exponent bit sub-set having a numerical value of 3 (e.g., a 32-bit posit bit string with es=3, or a (32,3) posit bit string) can have a dynamic range of approximately 145 decades.

Figure 4A:
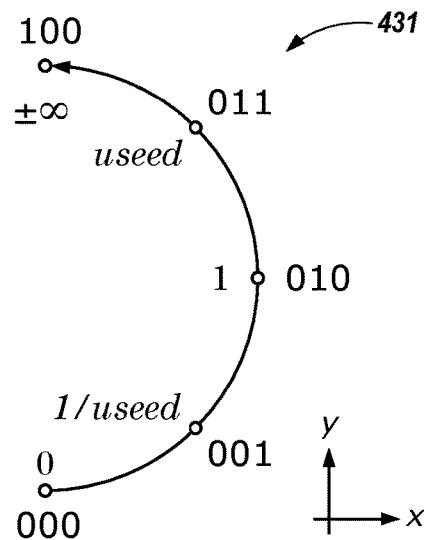
FIG. 4A is an example of positive values for a 3-bit posit.

FIG. 4A is an example of positive values for a 3-bit posit. In FIG. 4A, only the right half of projective real numbers, however, it will be appreciated that negative projective real numbers that correspond to their positive counterparts shown in FIG. 4A can exist on a curve representing a transformation about they-axis of the curves shown in FIG. 4A.

Figure 4B:
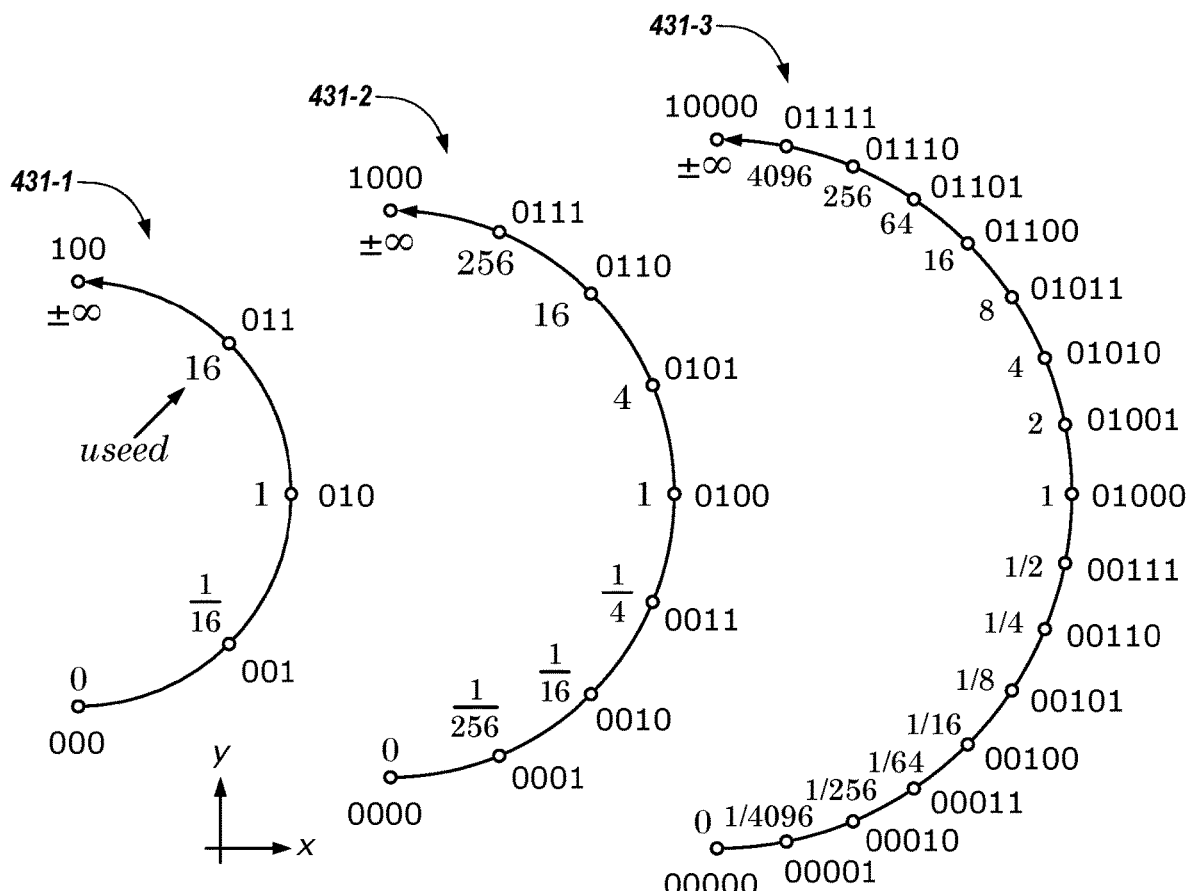
FIG. 4B is an example of posit construction using two exponent bits.

In the example of FIG. 4A, es=2, so useed=$2^{2^{es}}$=16. The precision of a posit 431-1 can be increased by appending bits the bit string, as shown in FIG. 4B. For example, appending a bit with a value of one (1) to bit strings of the posit 431-1 increases the accuracy of the posit 431-1 as shown by the posit 431-2 in FIG. 4B. Similarly, appending a bit with a value of one to bit strings of the posit 431-2 in FIG. 4B increases the accuracy of the posit 431-2 as shown by the posit 431-3 shown in FIG. 4B. An example of interpolation rules that may be used to append bits to the bits strings of the posits 431-1 shown in FIG. 4A to obtain the posits 431-2, 431-3 illustrated in FIG. 4B follow.

If maxpos is the largest positive value of a bit string of the posits 431-1, 431-2, 431-3 and minpos is the smallest value of a bit string of the posits 431-1, 431-2, 431-3, maxpos may be equivalent to useed and minpos may be equivalent to $$\frac{1}{useed}.$$

Between maxpos and ±∞, a new bit value may be maxpos*useed, and between zero and minpos, a new bit value may be $$\frac{minpos}{useed}.$$

These new bit values can correspond to a new regime bit 335. Between existing values x=2$^m$ and y=2$^n$, where m and n differ by more than one, the new bit value may be given by the geometric mean:

$$\sqrt{x \times y} = 2^{\frac{(m+n)}{2}},$$

which corresponds to a new exponent bit 337. If the new bit value is midway between the existing x and y values next to it, the new bit value can represent the arithmetic mean $$\frac{x+y}{2},$$

which corresponds to a new mantissa bit 339.

FIG. 4B is an example of posit construction using two exponent bits. In FIG. 4B, only the right half of projective real numbers, however, it will be appreciated that negative projective real numbers that correspond to their positive counterparts shown in FIG. 4B can exist on a curve representing a transformation about they-axis of the curves shown in FIG. 4B. The posits 431-1, 431-2, 431-3 shown in FIG. 4B each include only two exception values: Zero (0) when all the bits of the bit string are zero and ±∞ when the bit string is a one (1) followed by all zeros. It is noted that the numerical values of the posits 431-1, 431-2, 431-3 shown in FIG. 4 are exactly useed$^k$. That is, the numerical values of the posits 431-1, 431-2, 431-3 shown in FIG. 4 are exactly useed to the power of the k value represented by the regime (e.g., the regime bits 335 described above in connection with FIG. 3). In FIG. 4B, the posit 431-1 has es=2, so useed=2$^{2^{es}}$=16, the posit 431-2 has es=3, so useed=2$^{2^{es}}$=256, and the posit 431-3 has es=4, so useed=2$^{2^{es}}$=4096.

As an illustrative example of adding bits to the 3-bit posit 431-1 to create the 4-bit posit 431-2 of FIG. 4B, the useed=256, so the bit string corresponding to the useed of 256 has an additional regime bit appended thereto and the former useed, 16, has a terminating regime bit (r̄) appended thereto. As described above, between existing values, the corresponding bit strings have an additional exponent bit appended thereto. For example, the numerical values 1/16, 1/4, 1, and 4 will have an exponent bit appended thereto. That is, the final one corresponding to the numerical value 4 is an exponent bit, the final zero corresponding o the numerical value 1 is an exponent bit, etc. This pattern can be further seen in the posit 431-3, which is a 5-bit posit generated according to the rules above from the 4-bit posit 431-2. If another bit was added to the posit 431-3 in FIG. 4B to generate a 6-bit posit, mantissa bits 339 would be appended to the numerical values between 1/16 and 16.

A non-limiting example of decoding a posit (e.g., a posit 431) to obtain its numerical equivalent follows. In some embodiments, the bit string corresponding to a positp is an unsigned integer ranging from $-2^{n-1}$ to $2^{n-1}$, k is an integer corresponding to the regime bits 335 and e is an unsigned integer corresponding to the exponent bits 337. If the set of mantissa bits 339 is represented as {f$_1$f$_2$ . . . f$_{fs}$} and f is a value represented by 1. f$_1$f$_2$ . . . f$_{fs}$ (e.g., by a one followed by a decimal point followed by the mantissa bits 339), the p can be given by Equation 2, below.

$$x = \begin{cases} 0, & p = 0 \\ \pm\infty, & p = -2^{n-1} \\ \text{sign}(p) \times \text{useed}^k \times 2^e \times f, & \text{all other } p \end{cases} \quad \text{Equation 2}$$

A further illustrative example of decoding a posit bit string is provided below in connection with the posit bit string 0000110111011101 shown in Table 3, below follows.

TABLE 3

| SIGN | REGIME | EXPONENT | MANTISSA |
|------|--------|----------|----------|
| 0 | 0001 | 101 | 11011101 |

In Table 3, the posit bit string 0000110111011101 is broken up into its constituent sets of bits (e.g., the sign bit 333, the regime bits 335, the exponent bits 337, and the mantissa bits 339). Since es=3 in the posit bit string shown in Table 3 (e.g., because there are three exponent bits), useed=256. Because the sign bit 333 is zero, the value of the numerical expression corresponding to the posit bit string shown in Table 3 is positive. The regime bits 335 have a run of three consecutive zeros corresponding to a value of −3 (as described above in connection with Table 1). As a result, the scale factor contributed by the regime bits 335 is 256$^{-3}$ (e.g., useed$^k$). The exponent bits 337 represent five (5) as an unsigned integer and therefore contribute an additional scale factor of 2$^e$=2$^5$=32. Lastly, the mantissa bits 339, which are given in Table 3 as 11011101, represent two-hundred and twenty-one (221) as an unsigned integer, so the mantissa bits 339, given above as f are $$f + \frac{221}{256}.$$

Using these values and Equation 2, the numerical value corresponding to the posit bit string given in Table 3 is +

$$256^{-3} \times 2^5 \times \left(1 + \frac{221}{256}\right) = \frac{437}{134217728} \approx 3.55393 \times 10^{-6}.$$

Figure 5:
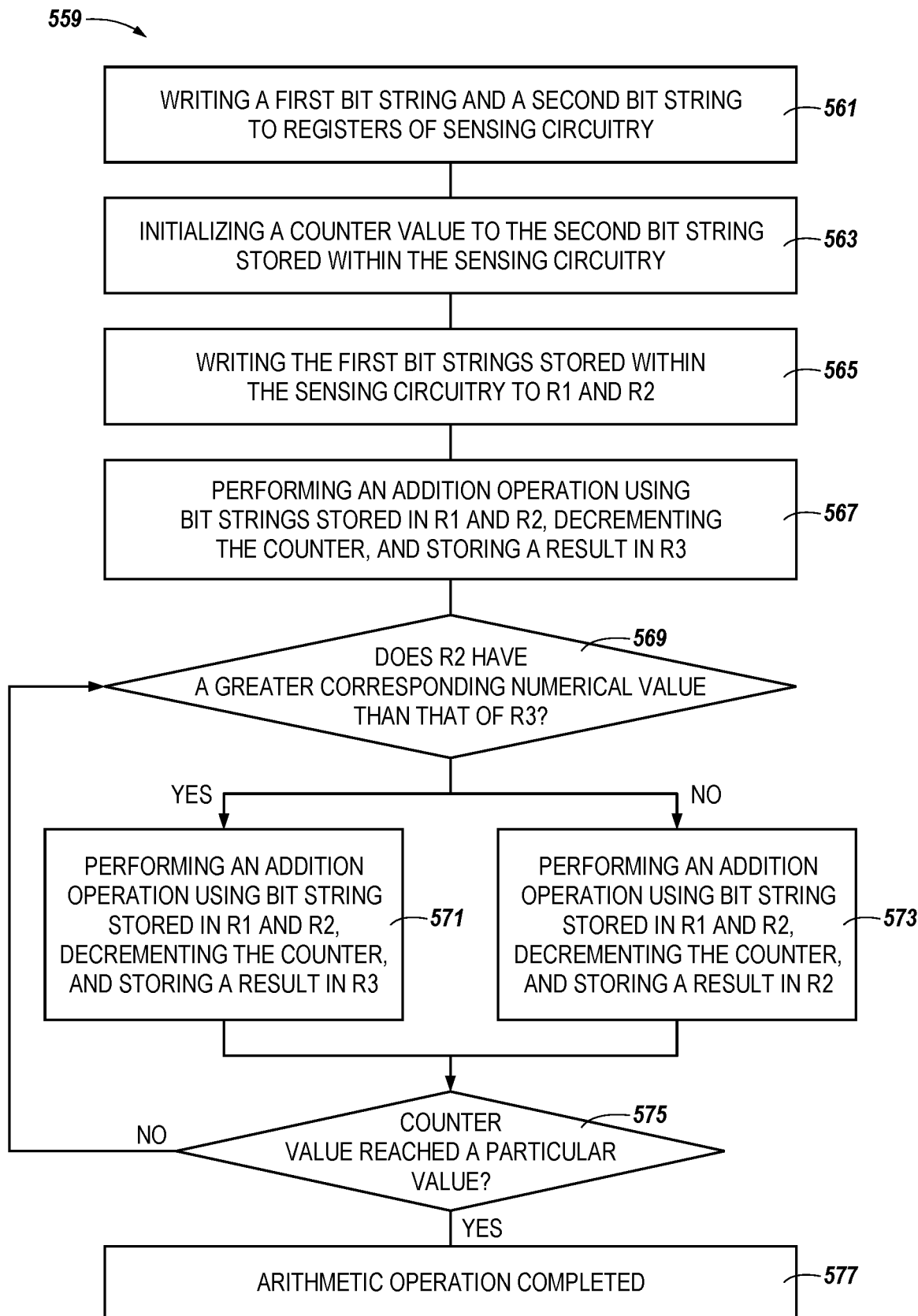
FIG. 5 is a flow diagram representing an example arithmetic operation in accordance with a number of embodiments of the present disclosure.

FIG. 5 is a flow diagram 559 representing an example arithmetic operation in accordance with a number of embodiments of the present disclosure. Although embodiments are not so limited, the arithmetic operation described in association with FIG. 5 can be a multiplication operation.

At block 561, a first bit string can be written (e.g., copied) to at least two registers (e.g., register 134 illustrated in FIG. 1) and a second bit string can be written to at least one register (e.g., register 134 illustrated in FIG. 1) of the sensing circuitry (e.g., sensing circuitry 150 illustrated in FIG. 1). The first bit string and the second bit string can be used as operands of the arithmetic operation. For example, a first numerical value and a second numerical value represented by the first bit string and the second bit string, respectively, can be operands of the arithmetic operation. In an exemplary scenario, the first bit string can represent a numerical value of 5 and the second bit string can represent a numerical value of 4. Accordingly, the first bit string representing a numerical value of 5 can be written to two registers (e.g., first and second registers) of the sensing circuitry and the second bit string representing a numerical value of 4 can be written to a different register (e.g., third register).

At block 563, a value of a counter (e.g., counter 114 illustrated in FIG. 1) can be initialized to a value of one of the registers (e.g., third register) to which the second bit string was previously written. In the exemplary scenario described above, for example, the counter value is initialized to a numerical value of 4.

At block 565, the bit string (e.g., first bit string) stored in the first register can be written to one row (e.g., R1) of the memory array (e.g., memory array 130 illustrated in FIG. 1) and the bit string (e.g., first bit string) stored in the second register can be written to a different row (e.g., R2) of the memory array. In the exemplary scenario described above, for example, the bit strings representing a numerical value of 5 can be written to the rows (e.g., R1 and R2) of the memory array.

At block 567, an addition operation is performed using corresponding numerical values represented by the bit strings stored in R1 and R2, and a result of the addition operation is stored in a row (e.g., R3), for example, different than R1 and R2. In the exemplary scenario described above, for example, a result of the addition operation with operands of 5 (e.g., R1) and 5 (e.g., R2) that corresponds to 10 is stored in R3 and the counter value (e.g., previously was 4) is decremented by 1 and becomes 3.

Over blocks 569, 571, 573, and 575, a corresponding numerical value (e.g., of a bit string) stored in either R2 or R3 is repetitively added to a corresponding numerical value stored in R1. For example, at block 569, if R3 has a greater corresponding numerical value than that of R2, the corresponding numerical value stored in R3 is added to a numerical value stored in R1, as illustrated at block 571. For example, if R2 has a greater corresponding numerical value than that of R3, the corresponding numerical value stored in R2 is added to a numerical value stored in R1, as illustrated at block 573. At block 571, once an addition operation using numerical values of R1 and R2 is performed, a value of the counter is decremented (e.g., by 1) and the result of the addition operation is stored in R3. At block 573, once an addition operation using numerical values of R1 and R3 is performed, a value of the counter is decremented (e.g., by 1) and the result of the addition operation is stored in R2. At block 575, a determination is made as to whether a value of the counter reached a particular value, such as 1. If it is determined that the value reached the particular value, the method 560 proceeds to 578. If it is determined that the value has not reached the particular value, the method 560 proceeds back to 569, in which another addition operation is performed using numerical values of R1 and either R2 or R3.

In the exemplary scenario described above, for example, in which the counter value was initialized to 4 and R1 and R2 store a same numerical value of 5, a first addition operation is performed using numerical values of R1 and R2 (e.g., as a part of performance of block 567), and a result, which is 10, is stored in R3. Since R3 has a greater numerical value (e.g., 10) than that stored in R2 (e.g., 5), a second addition operation is performed using numerical values of R1 (e.g., 5) and R3 and a result (e.g., 15) is stored in R2 (e.g., as a part of performance of block 573). As a result of performance of block 573, the counter value (e.g., previously was 3) is decremented by 1 and becomes 2. Since the counter value has not reached 1 yet, another addition operation (e.g., third addition operation) is performed. For the third addition operation, numerical values of R1 (e.g., 5) and R2 (e.g., 15) are used as operands, because R2 has a greater numerical value (e.g., 15) than that (e.g., 10) of R3. As a result of performance of block 571, the counter value (e.g., previously was 2) is decremented by 1 and becomes 1. Since the counter value has reached 1, no more addition operation needs to be performed.

At block 577, the arithmetic operation is deemed to be completed with one of numerical values stored in R2 or R3 corresponding to a result of the arithmetic operation. Whether the result of the arithmetic operation is stored in R2 or R3 can be indicated in various ways. For example, whichever (e.g., among bit strings stored in R2 and R3) has not been used as one of the operands in a last addition operation (e.g., among a number of addition operations performed as a part of performances of blocks 569, 571, 573 and 575) can correspond to a result of the arithmetic operation. Alternatively, whichever (e.g., among bit strings stored in R2 and R3) stores a result of the last addition operation (e.g., as illustrated in either block 571 or block 573) can correspond to a result of the arithmetic operation. Alternatively, because the row that stores a result of the last addition operation necessarily has a greater numerical value than the other row, whichever (e.g., among bit strings stored in R2 and R3) has a greater numerical value can correspond to a result of the arithmetic operation.

In the exemplary scenario described above, for example, a numerical value (e.g., 20) represented by the bit string stored in R3 (e.g., subsequent to three addition operations) can correspond to a result of the arithmetic operation, such as multiplication operation. Stated alternatively, the numerical value (e.g., 20) of R3 can correspond to the result of the multiplication operation performed using operands of 5 and 4.

In some embodiments, various formats of bit strings can be used in performing the arithmetic operation described in connection with FIG. 5. For example, the bit strings on which a number of addition operations (e.g., as described over blocks 569, 571, 573, and/or 575) are performed can have a unum format or a posit format, or a floating-point format or a fixed-point binary format. In the event that the bit strings are formatted to, for example, the posit format, the control circuitry (e.g., control circuitry 120/220 illustrated in FIGS. 1 and 2) can determine that whether the bit strings have a same bit string shape. If the bit strings do not have a same bit string shape, the control circuitry can perform one or more operations on the bit strings to ensure that the bit strings have a same bit string shape prior to performing the number of addition operations on the bit strings (e.g., within the memory array 130/230 illustrated in FIGS. 1 and 2). In some embodiments, ensuring that the bit strings have a same bit string shape can include ensuring that the bit strings have a same bit length for a particular bit sub-set (e.g., exponent bit sub-set) and/or ensuring that the bit strings have a same overall bit length.

FIG. 6 is a schematic diagram illustrating a portion of a memory array 645 including sensing circuitry in accordance with a number of embodiments of the present disclosure. The sensing component 650 represents one of a number of sensing components that can correspond to sensing circuitry 150/250 shown in FIGS. 1B and 2A.

In the example shown in FIG. 6, the memory array 645 is a DRAM array of 1T1C (one transistor one capacitor) memory cells in which a transistor serves as the access device and a capacitor serves as the storage element; although other embodiments of configurations can be used (e.g., 2T2C with two transistors and two capacitors per memory cell). In this example, a first memory cell comprises transistor 651-1 and capacitor 647-1, and a second memory cell comprises transistor 651-2 and capacitor 647-2, etc. In a number of embodiments, the memory cells may be destructive read memory cells (e.g., reading the data stored in the cell destroys the data such that the data originally stored in the cell is refreshed after being read).

The cells of the memory array 645 can be arranged in rows coupled by access lines 687-X (Row X), 687-Y (Row Y), etc., and columns coupled by pairs of complementary sense lines (e.g., digit lines 653-1 labelled DIGIT(n) and 653-2 labelled DIGIT(n) in FIG. 6). Although only one pair of complementary digit lines are shown in FIG. 6, embodiments of the present disclosure are not so limited, and an array of memory cells can include additional columns of memory cells and digit lines (e.g., 4,096, 8,192, 16,384, etc.).

Memory cells can be coupled to different digit lines and word lines. For instance, in this example, a first source/drain region of transistor 651-1 is coupled to digit line 653-1, a second source/drain region of transistor 651-1 is coupled to capacitor 647-1, and a gate of transistor 651-1 is coupled to word line 687-Y. A first source/drain region of transistor 651-2 is coupled to digit line 653-2, a second source/drain region of transistor 651-2 is coupled to capacitor 647-2, and a gate of transistor 651-2 is coupled to word line 687-X. A cell plate, as shown in FIG. 6, can be coupled to each of capacitors 647-1 and 647-2. The cell plate can be a common node to which a reference voltage (e.g., ground) can be applied in various memory array configurations.

The digit lines 653-1 and 653-2 of memory array 645 are coupled to sensing component 650 in accordance with a number of embodiments of the present disclosure. In this example, the sensing component 650 comprises a sense amplifier 649 and a compute component 665 corresponding to a respective column of memory cells (e.g., coupled to a respective pair of complementary digit lines). The sense amplifier 649 is coupled to the pair of complementary digit lines 653-1 and 653-2. The compute component 665 is coupled to the sense amplifier 649 via pass gates 655-1 and 655-2. The gates of the pass gates 655-1 and 655-2 can be coupled to selection logic 613.

The selection logic 613 can include pass gate logic for controlling pass gates that couple the pair of complementary digit lines un-transposed between the sense amplifier 649 and the compute component 665 and swap gate logic for controlling swap gates that couple the pair of complementary digit lines transposed between the sense amplifier 649 and the compute component 665. The selection logic 613 can be coupled to the pair of complementary digit lines 653-1 and 653-2 and configured to perform logical operations on data stored in array 645. For instance, the selection logic 613 can be configured to control continuity of (e.g., turn on/turn off) pass gates 655-1 and 655-2 based on a selected logical operation that is being performed.

The sense amplifier 649 can be operated to determine a data value (e.g., logic state) stored in a selected memory cell. The sense amplifier 649 can comprise a cross coupled latch 615 (e.g., gates of a pair of transistors, such as n-channel transistors 685-1 and 685-2 are cross coupled with the gates of another pair of transistors, such as p-channel transistors 641-1 and 641-2), which can be referred to herein as a primary latch. However, embodiments are not limited to this example.

In operation, when a memory cell is being sensed (e.g., read), the voltage on one of the digit lines 653-1 or 653-2 will be slightly greater than the voltage on the other one of digit lines 653-1 or 653-2. An ACT signal and an RNL* signal can be driven low to enable (e.g., fire) the sense amplifier 649. The digit line 653-1 or 653-2 having the lower voltage will turn on one of the transistors 641-1 or 641-2 to a greater extent than the other of transistors 641-1 or 641-2, thereby driving high the digit line 649-1 or 649-2 having the higher voltage to a greater extent than the other digit line 649-1 or 649-2 is driven high.

Similarly, the digit line 649-1 or 649-2 having the higher voltage will turn on one of the transistors 685-1 or 685-2 to a greater extent than the other of the transistors 685-1 or 685-2, thereby driving low the digit line 649-1 or 649-2 having the lower voltage to a greater extent than the other digit line 649-1 or 649-2 is driven low. As a result, after a short delay, the digit line 649-1 or 649-2 having the slightly greater voltage is driven to the voltage of the supply voltage Vcc through a source transistor, and the other digit line 649-1 or 649-2 is driven to the voltage of the reference voltage (e.g., ground) through a sink transistor. Therefore, the cross coupled transistors 685-1 and 685-2 and transistors 641-1 and 641-2 serve as a sense amplifier pair, which amplify the differential voltage on the digit lines 649-1 and 649-2 and operate to latch a data value sensed from the selected memory cell.

Embodiments are not limited to the sensing component configuration illustrated in FIG. 6. As an example, the sense amplifier 649 can be a current-mode sense amplifier and/or a single-ended sense amplifier (e.g., sense amplifier coupled to one digit line). Also, embodiments of the present disclosure are not limited to a folded digit line architecture such as that shown in FIG. 6.

The sensing component 650 can be one of a plurality of sensing components selectively coupled to a shared I/O line. As such, the sensing component 650 can be used in association with reversing data stored in memory in accordance with a number of embodiments of the present disclosure.

In this example, the sense amplifier 649 includes equilibration circuitry 681, which can be configured to equilibrate the digit lines 649-1 and 649-2. The equilibration circuitry 681 comprises a transistor 658 coupled between digit lines 649-1 and 649-2. The equilibration circuitry 681 also comprises transistors 677-1 and 677-2 each having a first source/drain region coupled to an equilibration voltage (e.g., $V_{DD}/2$), where $V_{DD}$ is a supply voltage associated with the array. A second source/drain region of transistor 677-1 is coupled to digit line 649-1, and a second source/drain region of transistor 677-2 is coupled to digit line 649-2. Gates of transistors 658, 677-1, and 677-2 can be coupled together and to an equilibration (EQ) control signal line 679. As such, activating EQ enables the transistors 658, 677-1, and 677-2, which effectively shorts digit lines 649-1 and 649-2 together and to the equilibration voltage (e.g., $V_{DD}/2$). Although FIG. 6 shows sense amplifier 649 comprising the equilibration circuitry 681, embodiments are not so limited, and the equilibration circuitry 681 may be implemented discretely from the sense amplifier 649, implemented in a different configuration than that shown in FIG. 6, or not implemented at all.

As shown in FIG. 6, the compute component 665 can also comprise a latch, which can be referred to herein as a secondary latch 691. The secondary latch 691 can be configured and operated in a manner similar to that described above with respect to the primary latch 689, with the exception that the pair of cross coupled p-channel transistors (e.g., PMOS transistors) included in the secondary latch can have their respective sources coupled to a supply voltage 636-2 (e.g., $V_{DD}$), and the pair of cross coupled n-channel transistors (e.g., NMOS transistors) of the secondary latch can have their respective sources selectively coupled to a reference voltage 636-1 (e.g., ground), such that the secondary latch is continuously enabled. The configuration of the compute component 665 is not limited to that shown in FIG. 6, and various other embodiments are feasible.

Figure 7:
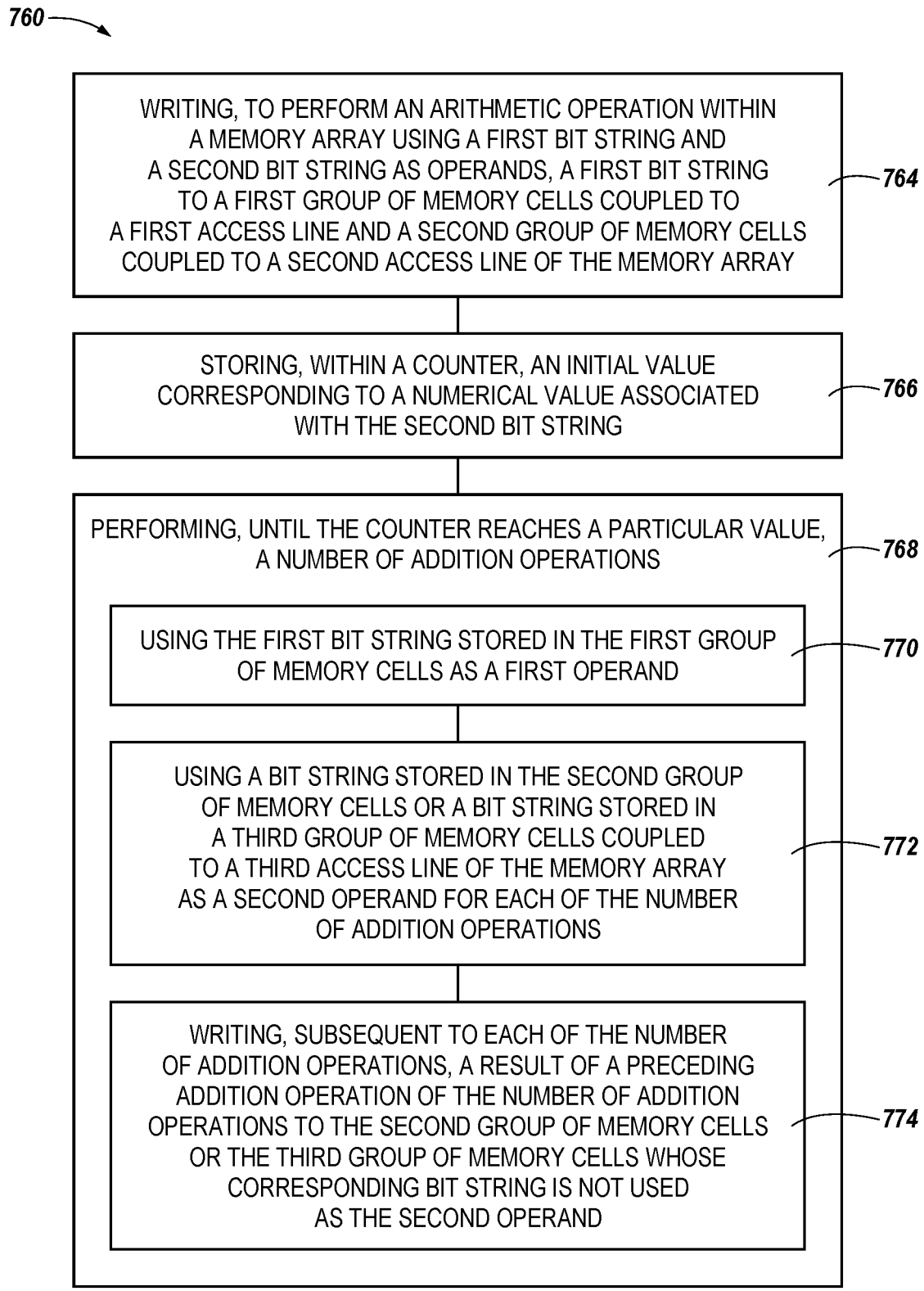
FIG. 7 is a flow diagram representing an example method for arithmetic operations in memory in accordance with a number of embodiments of the present disclosure.

FIG. 7 is a flow diagram representing an example method 760 for arithmetic operations in memory in accordance with a number of embodiments of the present disclosure. The method 760 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 764, the method 760 can include writing, to perform an arithmetic operation within a memory array (e.g., the memory array 130/230 illustrated in FIGS. 1A-1B and 2A), the first bit string to a first group of memory cells coupled to a first access line and a second group of memory cells coupled to a second access line of the memory array. In some embodiments, the arithmetic operation can include a multiplication operation. At block 766, the method 760 can include storing, within a counter (e.g., counter 134 illustrated in FIG. 1), an initial value corresponding to a numerical value associated with the second bit string.

At block 768, the method 760 can include performing, until the counter reaches a particular value, a number of addition operations. For example, the number of addition operations can be performed until the counter reaches the particular value of 1. In some embodiments, the method 760 further includes updating (e.g., decrementing) a value associated with the counter responsive to completion of each of the number of addition operations. Performing the number of addition operations can include, for each of the number of addition operations, various steps as described in blocks 770, 772, and 774.

At block 770, the method 760 can include using the first bit string stored in the first group of memory cells as a first operand for each of the number of addition operations. At block 772, the method 760 can include, for each of the number of addition operations, alternatively using a bit string stored in the second group of memory cells or a bit string stored in a third group of memory cells coupled to a third access line of the memory array as a second operand for each of the number of addition operations.

At block 774, the method 760 can include, for each of the number of addition operations, writing, subsequent to each of the number of addition operations, a result of a preceding addition operation of the number of addition operations to the second group of memory cells or the third group of memory cells whose corresponding bit string is not used as the second operand. A result of the number of addition operations stored in the second group of memory cells or the third group of memory cells when the counter reaches the particular value corresponds to a result of the arithmetic operation. In some embodiments, the result of the arithmetic operation can be stored within the memory array.

In some embodiments, the result can be written to the second group of memory cells or the third group of memory cells whose corresponding bit string is not used as the second operand of a respective one of the number of addition operations. For example, once a bit string stored in the second group of memory cells is used as the second operand (e.g., along with the first bit string as the first operand) in a particular one of the number of addition operations, a result of the particular addition operation can be written to the third group of memory cells.

In some embodiments, the first bit string or the second bit string, or both, can include a bit indicating whether a respective bit string is a negative or a positive value. In this example, the method 760 can further include associating, to the result of the multiplication operation, a resultant sign bit indicative of a positive value in response to the sign bits of the first and the second bit strings each having a same bit value. In contrast, the method 760 includes associating, to the result of the multiplication operation, a resultant sign bit indicative of a negative value in response to the sign bits of the first and the second bit strings each having a different bit value. While the number of addition operations are being performed, the control circuitry (e.g., control circuitry 120/220 illustrated in FIGS. 1 and 2) can be configured to store a resultant sign bit such that the control circuitry can associated the sign bit to a result of the number of addition operation subsequently. However, embodiments are not so limited. For example, the resultant sign bit can be stored, while the number of addition operations are being performed, within the memory array (e.g., a particular row and/or column of the memory array).

As described herein, the arithmetic operation can be performed with various formats of bit strings. For example, to perform the arithmetic operation with an IEEE 754 floating-point format or a fixed-point binary format, a conversion operation can be performed on bit strings (e.g., stored within the memory array) that are formatted according to a universal number format or a posit format to convert the format to the IEEE 754 floating-point format or the fixed-point binary format. Subsequent to the conversion and once the converted bit strings are stored back to the memory array, the arithmetic operation can be performed with the IEEE 754 floating-point format or the fixed-point binary format.

Subsequent to performance of the arithmetic operation, a result of the arithmetic operation can be stored according to various format. For example, if it is desired to store and/or provide the result in the universal number format or the posit format, the result that is formatted according to the IEEE 754 floating-point format or the fixed-point binary format can be converted back (e.g., at the logic circuitry 122 and/or host 102 illustrated in FIG. 1) to the universal number format or the posit format.

FIG. 8 is a flow diagram representing an example method 880 for arithmetic operations in memory in accordance with a number of embodiments of the present disclosure. The method 880 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 884, the method 880 can include converting, to perform a multiplication operation using operands of numerical values indicated by respective bit strings, each of the respective bit strings to a number of bit strings each corresponding to a numerator or a denominator of a respective one of the numerical values. In some embodiments, one or more of the respective bit strings can include a fraction bit indicating that the one or more of the respective bit strings is in a fraction form. At block 886, the method 880 can include writing a first bit string of the number of bit strings corresponding to one of the numerators of the operands to a first row and a second row of a memory array.

At block 888, the method 880 can include updating a value of a counter (e.g., counter 134 illustrated in FIG. 1) in response to writing the first bit string. As described herein, the value of the counter can be updated to a numerical value of a bit string corresponding to one of the numerators. At block 890, the method 880 can include performing, until the value of the counter reaches a particular value, a number of first addition operations. As described herein, the number of first addition operations can be performed until the value of the counter reaches a value of 1. Performing the number of first addition operation according to block 890 includes various steps as described in blocks 892, 894, and 896.

At block 892, the method 880 can include using the first bit string stored in the first row as a first operand. At block 894, the method 880 can include using, as a second operand, a bit string stored in the second row or a bit string stored in a third row of the memory array, whichever has a greater corresponding numerical value.

At block 896, the method 880 can include writing, subsequent to each of the number of first addition operations, a result of a respective one of the number of first addition operations alternatively in the second row or the third row of the memory array. In some embodiments, the result of the respective one of the number of first addition operations can be written to the second row or the third row of the memory array, whichever has a lesser corresponding numerical value. A result of a first portion of the multiplication operation is stored in the second row or the third row, whichever has a greater corresponding numerical value.

To perform, for example, a multiplication operation using operands that are in forms of fractions, at least two multiplication operations can be performed respectively on numerators and denominators. While those steps described in association with FIG. 8 are directed to the multiplication operation of the numerators, similar steps can be performed again on bits strings representative of denominators. For example, the method 880 can include (e.g., similarly to the step described in connection with block 886) writing a third bit string of the number of bit strings indicating one of the denominators of the operands to a fourth row and a fifth row of the memory array. The method 880 can further include (e.g., similarly to the step described in connection with block 888) updating a value of the counter in response to writing the third bit string.

The method 880 can further include (e.g., similarly to the step described in connection with block 890) performing a number of second addition operations until the counter reaches a numerical value of 1. The method 880 can further include (e.g., similarly to the step described in connection with block 892) using the third bit string in the third row as one operand of the number of second addition operations. The method 880 can further include (e.g., similarly to the step described in connection with block 894) using, as another operand of the number of second addition operations, a bit string stored in fifth row or a bit string stored in a sixth row of the memory array, whichever has a greater corresponding numerical value. The method 880 can further include (e.g., similarly to the step described in connection with block 896) writing, subsequent to each of the number of second addition operations, a result of a respective one of the number of second addition operations alternatively in the fifth row or the sixth row of the memory array. Subsequent to the number of second addition operations, a result of a second portion of the multiplication operation is stored in the fifth row or the sixth row, whichever has a greater corresponding numerical value.

In response to obtaining the results of the first portion and the second portion of the multiplication operation, a division operation can be performed using logic circuitry (e.g., logic circuitry 122 illustrated in FIG. 1) by dividing the result of the first portion by the result of the second portion. A result of the division operation can correspond to a result of the multiplication operation.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
performing an arithmetic operation within a memory array using a first bit string and a second bit string by performing a number of iterations corresponding to a numerical value of the second bit string by, for each one of the number of iterations:
performing a respective addition operation using:
the first bit string as a first operand; and
a bit string stored in a first group of memory cells or a second group of memory cells as a second operand, wherein the first group of memory cells stores the first bit string prior to the number of iterations; and
writing a result of the respective addition operation to the first group of memory cells or the second group of memory cells whose corresponding bit string is not used as the first operand,
wherein a result of the number of iterations written to the first or the second group of memory cells corresponds to a result of the arithmetic operation.

2. The method of claim 1, further comprising, prior to performing the number of iterations, storing a numerical value corresponding to the second bit string in a counter to track the number of times the number of iterations are performed.

3. The method of claim 2, further comprising decrementing or incrementing the counter until the counter reaches a particular value, which indicates that the number of iterations were performed for the number of times.

4. The method of claim 1, further comprising, prior to performing the number of iterations, converting the first bit string or the second bit string, or both, to an IEEE 754 floating-point format or a fixed-point binary format from a universal number format or a posit format.

5. The method of claim 1, further comprising, subsequent to performance of the number of iterations:
converting the result of the arithmetic operation that is in an IEEE 754 floating-point format or a fixed-point binary format to a universal number format or an posit format; and
writing the result of the arithmetic operation having the converted format to the memory array.

6. An apparatus, comprising:
a memory array comprising a first group of memory cells and a second group of memory cells that are initially configured for a first bit string;
sensing circuitry coupled to the memory array; and
control circuitry coupled to the sensing circuitry and the memory array, wherein the control circuitry is configured to, to perform an arithmetic operation using the first bit string and a second bit string as operands:
cause the sensing circuitry to perform a number of iterations for a number of times corresponding to a numerical value of the second bit string, wherein the sensing circuitry is configured to, for each one of the number of iterations:
perform a respective addition operation using the first bit string stored in the first group of memory cells and a bit string stored in the second or a third group of memory cells, whichever stores a bit string having a greater numerical value; and
write a result of the respective addition operation to the second or third group of memory cells, whichever stores a bit string having a lesser numerical value,
wherein a result a last addition operation of the number of iterations corresponds to a result of the arithmetic operation.

7. The apparatus of claim 6, wherein the control circuitry is configured to:
receive a request to perform the arithmetic operation using the first bit string and the second bit string that are stored in the memory array in a first format; and
in response to the request:
retrieve the first bit string and the second bit string; and
convert a format of the first bit string and the second bit string from the first format to a second format to cause the sensing circuitry to perform the number of iterations using the first bit string and the second bit string with the second format.

8. The apparatus of claim 7, wherein the control circuitry is configured to:

retrieve the result of the arithmetic operation having the second format from the sensing circuitry;
convert a format of the result of the arithmetic from the second format to the first format; and
cause the sensing circuitry to write the result of the arithmetic operation in the memory array in the first format.

9. The apparatus of claim 7, wherein the first format is an IEEE 754 floating-point format or a fixed-point binary format.

10. The apparatus of claim 7, wherein the second format is a Type III universal number format or a posit format.

11. The apparatus of claim 7, wherein the first format includes a mantissa, a base, and an exponent portion.

12. The apparatus of claim 7, wherein the second format includes a sign bit sub-set, a regime bit sub-set, a mantissa bit sub-set, and an exponent bit sub-set.

13. The apparatus of claim 12, wherein the first bit string and the second bit string in the second format have a same bit length of the exponent bit sub-set.

14. The apparatus of claim 6, wherein the control circuitry comprises a counter, and wherein the control circuitry is configured to:
write the second numerical value to the counter prior to causing the sensing circuitry to perform the number of iterations; and
decrement the counter for each of the number of iterations.

15. The apparatus of claim 6, wherein a bit string stored in the second or the third group of memory cells, whichever has a greater numerical value subsequent to the number of iterations, corresponds to the result of the arithmetic operation.

16. The apparatus of claim 6, wherein the sensing circuitry further comprises a number of registers, the sensing circuitry configured to write, during a first iteration of the number of iterations, the first bit string respectively to a first and a second registers of the number of registers.

17. The apparatus of claim 6, wherein the sensing circuitry is further configured to write, during a second iteration of the number of iterations, a result of the respective addition operation to the third group of memory cells.

18. A method, comprising:
converting, to perform an arithmetic operation within a memory array using respective bit strings that are in a fraction form as operands, the respective bit strings at least to a first bit string and a second bit string respectively corresponding to numerators of the respective bit strings;
writing the first bit string to a first group of memory cells and a second group of memory cells of the memory array; and
performing a first number of iterations for a number of times corresponding to a numerical value of the second bit string by, for each one of the number of iterations:
performing a respective addition operation using:
the first bit string; and
a bit string stored in the second group of memory cells or a third group of memory cells; and
writing a result of the respective addition operation to the second group of memory cells or the third group of memory cells, whichever stores a bit string having a lesser numerical value,
wherein a result of the first number of iterations corresponds to a numerator of a result of the arithmetic operation.

19. The method of claim 18, further comprising:
converting the respective bit strings further to a third bit string and a fourth bit string respectively corresponding to denominators of the respective bit strings;
writing the third bit string to a fourth group of memory cells of the memory array and the fourth bit string to a fifth group of memory cells of the memory array; and
performing a second number of iterations for a number of times corresponding to a numerical value of the fourth bit string by, for each one of the number of iterations:
performing a respective addition operation using:
the third bit string; and
a bit string stored in the fourth group of memory cells or a fifth group of memory cells; and
writing a result of the respective addition operation to the fourth group of memory cells or the fifth group of memory cells, whichever stores a bit string having a lesser numerical value,
wherein a result of the second number of iterations corresponds to a denominator of a result of the arithmetic operation.

20. The method of claim 19, further comprising:
performing a division operation by dividing the result of the first number of iterations by the result of the second number of iterations, wherein a result of the division operation is the result of the arithmetic operation.

\* \* \* \* \*